(12) United States Patent
Kim et al.

(10) Patent No.: US 12,438,096 B2
(45) Date of Patent: Oct. 7, 2025

(54) FLEXIBLE FILM AND DISPLAY DEVICE INCLUDING THE SAME

(71) Applicant: Samsung Display Co., LTD., Yongin-si (KR)

(72) Inventors: Soo Yeon Kim, Namyangju-si (KR); Tae Gon Im, Seongnam-si (KR); Ji Hyun Kim, Yongin-si (KR); Jong Jae Lee, Seoul (KR); Jun Pyo Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 477 days.

(21) Appl. No.: 18/087,174

(22) Filed: Dec. 22, 2022

(65) Prior Publication Data

US 2023/0268282 A1    Aug. 24, 2023

(30) Foreign Application Priority Data

Feb. 22, 2022    (KR) .......................... 10-2022-0022931

(51) Int. Cl.
- *H01L 23/538* (2006.01)
- *G09G 3/3233* (2016.01)
- *H01L 25/16* (2023.01)

(52) U.S. Cl.
CPC ....... *H01L 23/5386* (2013.01); *G09G 3/3233* (2013.01); *H01L 25/167* (2013.01); *G09G 2300/0426* (2013.01); *G09G 2300/0842* (2013.01); *H01L 23/5387* (2013.01)

(58) Field of Classification Search
CPC ............. H01L 23/5386; H01L 23/5387; H01L 25/167; G09G 3/3233; G09G 2300/0426; G09G 2300/0819; G09G 2300/0842
See application file for complete search history.

(56) References Cited

U.S. PATENT DOCUMENTS

| | | | |
|---|---|---|---|
| 9,237,628 | B2 | 1/2016 | Shin et al. |
| 2014/0111116 | A1* | 4/2014 | Shin ...................... H05B 45/60 315/312 |

(Continued)

FOREIGN PATENT DOCUMENTS

| | | |
|---|---|---|
| KR | 10-2007-0010288 | 1/2007 |
| KR | 10-1484642 | 1/2015 |
| KR | 10-2015-0064797 | 6/2015 |

(Continued)

*Primary Examiner* — Anne M Hines
(74) *Attorney, Agent, or Firm* — Womble Bond Dickinson (US) LLP

(57) ABSTRACT

A flexible film includes first input pad parts and second input pad parts, first output pad parts corresponding to the first input pad parts and second output pad parts corresponding to the second input pad parts, a first voltage line supplying a first voltage received from the first input pad parts to the first output pad parts, and a second voltage line supplying a second voltage received from the second input pad parts and the second voltage being lower than the first voltage to the second output pad parts. The first voltage line includes first vertical voltage lines electrically connected between the first input pad parts and the first output pad parts, and first horizontal voltage lines electrically connecting adjacent first vertical voltage lines of the first vertical voltage lines to each other.

20 Claims, 15 Drawing Sheets

(56) References Cited

U.S. PATENT DOCUMENTS

2014/0117314 A1* 5/2014 Jeong .................... C12P 13/227
　　　　　　　　　　　　　　　　　　　　　　　257/40
2018/0020550 A1* 1/2018 Jang ....................... H05K 1/118

FOREIGN PATENT DOCUMENTS

| KR | 10-2015-0123058 | 11/2015 |
| KR | 10-2018-0008999 | 1/2018 |
| KR | 10-2018-0025392 | 3/2018 |
| KR | 10-2018-0035270 | 4/2018 |

* cited by examiner

FLEXIBLE FILM AND DISPLAY DEVICE INCLUDING THE SAME

CROSS-REFERENCE TO RELATED APPLICATION(S)

This application claims priority to and benefits of Korean Patent Application No. 10-2022-0022931 under 35 U.S.C. § 119 filed on Feb. 22, 2022, in the Korean Intellectual Property Office, the entire contents of which are incorporated herein by reference.

BACKGROUND

1. Technical Field

The disclosure relates to a flexible film and a display device including the same.

2. Description of the Related Art

Display devices have been applied to various electronic devices such as smartphones, digital cameras, laptop computers, navigation devices, and smart televisions. The display device may be a liquid crystal display device, a field emission display device, or a light emitting display device. The light emitting display device may display an image without a backlight unit providing light to a display panel because each of pixels of the display panel may include light emitting elements that may emit light by themselves.

A display driver supplying voltages or signals in order to drive the display panel of the display device may be connected to the display panel or a flexible film connected to the display panel. A method of mounting the display driver may be classified into a chip on glass (COG) method or a chip on film (COF) method. In the COG method, the display driver may be mounted on a substrate of the display panel, and in the COF method, the flexible film on which the display driver is mounted may be connected to a substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a flexible film capable of minimizing a deviation between magnitudes of currents flowing to voltage lines connected to a display panel even in case that resistances of load resistors of the display panel are different from each other, and a display device including the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a flexible film may include first input pad parts and second input pad parts; first output pad parts corresponding to the first input pad parts and second output pad parts corresponding to the second input pad parts; a first voltage line supplying a first voltage received from the first input pad parts to the first output pad parts; and a second voltage line supplying a second voltage received from the second input pad parts and the second voltage being lower than the first voltage to the second output pad parts. The first voltage line may include first vertical voltage lines electrically connected between the first input pad parts and the first output pad parts; and first horizontal voltage lines electrically connecting adjacent first vertical voltage lines of the first vertical voltage lines to each other.

A width of each of the first horizontal voltage lines may be greater than or equal to a width of each of the first vertical voltage lines.

A resistance of a first line resistor for a unit length of the first vertical voltage lines may be greater than a resistance of a second line resistor for a unit length of the first horizontal voltage lines.

The second voltage line may include second vertical voltage lines electrically connected between the second input pad parts and the second output pad parts; and second horizontal voltage lines electrically connecting adjacent second vertical voltage lines of the second vertical voltage lines to each other.

A width of each of the second horizontal voltage lines may be greater than or equal to a width of each of the second vertical voltage lines.

The first voltage line may be disposed at an edge of the flexible film and another edge of the flexible film opposite to the edge. The second voltage line may be disposed further inside the flexible film than the first voltage line.

The first voltage line may be disposed at an edge of the flexible film. The second voltage line may be disposed at another edge of the flexible film opposite to the edge of the flexible film.

The second voltage line may include second voltage lines. The second voltage lines may be electrically connected between the second input pad parts and the second output pad parts and may extend side by side.

The first voltage line may be disposed at an edge of the flexible film and another edge of the flexible film opposite to the edge. The second voltage line may be disposed further inside the flexible film than the first voltage line.

The first voltage line may be disposed at an edge of the flexible film. The second voltage line may be disposed at another edge of the flexible film opposite to the edge of the flexible film.

According to an embodiment, a display device may include a display panel; and a flexible film connected to the display panel. The flexible film may include first input pad parts and second input pad parts; first output pad parts corresponding to the first input pad parts and second output pad parts corresponding to the second input pad parts; a first voltage line supplying a first voltage received from the first input pad parts to the first output pad parts; and a second voltage line supplying a second voltage received from the second input pad parts and the second voltage being lower than the first voltage to the second output pad parts. The first voltage line may include first vertical voltage lines electrically connected between the first input pad parts and the first output pad parts; and first horizontal voltage lines electrically connecting adjacent first vertical voltage lines of the first vertical voltage lines to each other.

A width of each of the first horizontal voltage lines may be greater than or equal to a width of each of the first vertical voltage lines.

A resistance of a first line resistor for a unit length of the first vertical voltage lines may be greater than a resistance of a second line resistor for a unit length of the first horizontal voltage lines.

The second voltage line may include second vertical voltage lines electrically connected between the second input pad parts and the second output pad parts; and second horizontal voltage lines electrically connecting adjacent second vertical voltage lines of the second vertical voltage lines to each other.

A width of each of the second horizontal voltage lines may be greater than or equal to a width of each of the second vertical voltage lines.

The display device may further include a display driver mounted on a central portion of the flexible film. The first voltage line may be disposed at an edge of the flexible film and another edge of the flexible film opposite to the edge. The second voltage line may be disposed between the first voltage line and the display driver.

The display device may further comprise a display driver mounted on a central portion of the flexible film. The first voltage line may be disposed on a side of the display driver. The second voltage line may be disposed on another side of the display driver opposite to the side of the display driver.

The second voltage line may include second voltage lines. The second voltage lines may be electrically connected between the second input pad parts and the second output pad parts and may extend side by side.

The display device may further comprise a display driver mounted on a central portion of the flexible film. The first voltage line may be disposed at an edge of the flexible film and another edge of the flexible film opposite to the edge. The second voltage line may be disposed between the first voltage line and the display driver.

The display device may further include a display driver mounted on a central portion of the flexible film. The first voltage line may be disposed on a side of the display driver. The second voltage line may be disposed on another side of the display driver opposite to the side of the display driver.

With a flexible film and a display device including the same according to embodiments, voltage lines may include horizontal voltage lines electrically connecting adjacent vertical voltage lines to each other, such that it is possible to minimize a deviation between magnitudes of currents flowing to vertical voltage lines connected to a display panel even in case that resistances of load resistors of the display panel are different from each other, and it is possible to prevent a current from being concentrated on some of the vertical voltage lines to prevent ignition or smoke of the flexible film.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
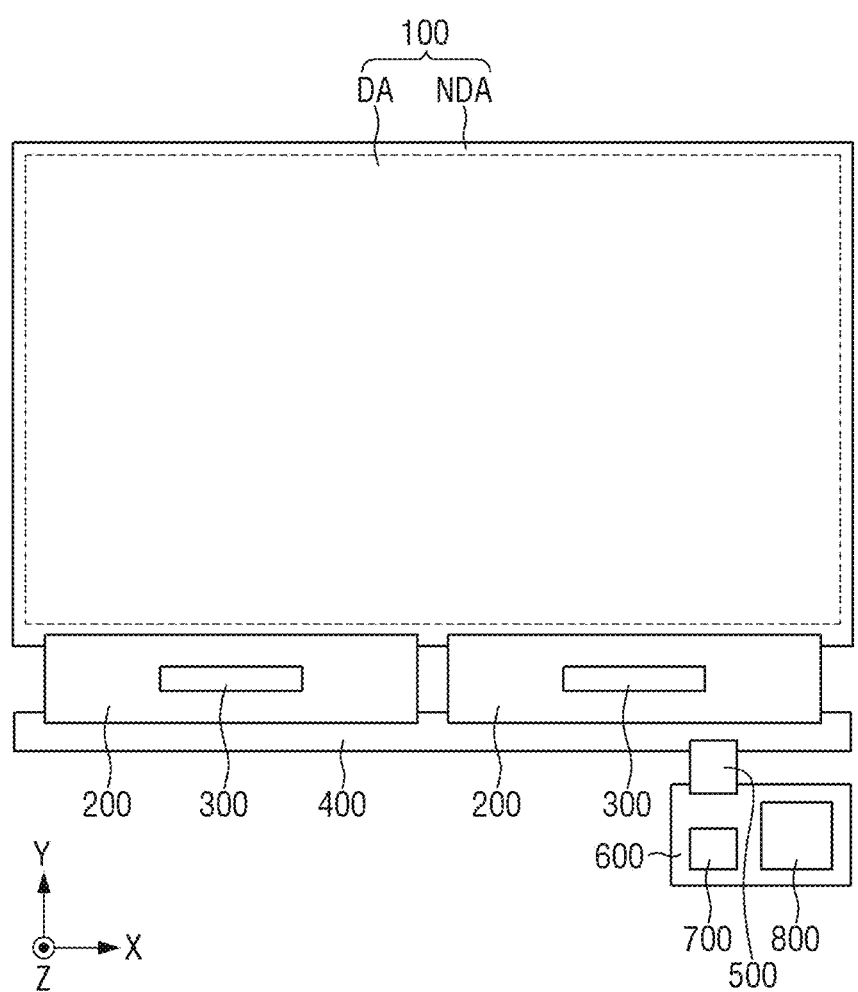
FIG. 1 is a schematic plan view illustrating a display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the disclosures disclosed herein. It is apparent, however, that various embodiments may be practiced without these details or with one or more equivalent arrangements. In other instances, well-known structures and devices may be shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe an elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or at other orientations), and, as such, the spatially relative descriptors used herein should be interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (for example, microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (for example, one or more programmed microprocessors and associated circuitry) to perform other functions.

Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments will be described with reference to the accompanying drawings.

FIG. 1 is a schematic plan view illustrating a display device according to an embodiment.

Referring to FIG. 1, a display device is a device that displays a moving image or a still image, and may be used as a display screen of various products such as televisions, laptop computers, monitors, billboards, and Internet of Things (IoT) as well as portable electronic devices such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs).

The display device may include a display panel 100, flexible films 200, display drivers 300, a first circuit board 400, a cable 500, a second circuit board 600, a power supply unit 700, and a timing controller 800.

The display panel 100 may have a rectangular shape in a plan view. For example, the display panel 100 may have a rectangular shape, in a plan view, having long sides in a first direction (X-axis direction) and short sides in a second direction (Y-axis direction). A corner where the long side in the first direction (X-axis direction) and the short side in the second direction (Y-axis direction) meet may be right-angled or may be rounded with a curvature. The shape of the display panel 100 in a plan view is not limited to the rectangular shape, and may be other polygonal shapes, a circular shape, or an elliptical shape. As an example, the display panel 100 may be formed to be flat, but is not limited thereto. As another example, the display panel 100 may be formed to be bent with a curvature.

The display panel 100 may include a display area DA and a non-display area NDA.

The display area DA is an area displaying an image, and may be defined as a central area of the display panel 100. The display area DA may include pixels, gate lines, data lines, and power lines. The pixel may be formed in each pixel area where the data line and the gate line intersect each other. The pixel may receive a gate signal from the gate line, receive a data voltage from the data line, and receive a source supply voltage from a power line. The pixel may be defined as an area of a minimum unit outputting light.

The non-display area NDA may be defined as an area other than the display area DA in the display panel 100. For example, the non-display area NDA may include fan-out lines (not illustrated) connecting the data lines and the power lines to the display driver 300 and pad parts (not illustrated) connected to the flexible films 200.

The flexible films 200 may electrically connect the display panel 100 and the display drivers 300 to each other. Input pad parts provided on one sides or sides of the flexible films 200 may be attached to the first circuit board 400 by a film attaching process, and output pad parts provided on the other sides of the flexible films 200 may be attached to the pad parts of the display panel 100 by a film attaching process. For example, the flexible film 200 may have flexibility like a chip on film or a tape carrier package, and may thus be bent. The flexible films 200 may be bent below the display panel 100 in order to decrease a bezel area of the display device. The display device may include at least one flexible film 200. The display device of FIG. 1 may include two flexible films 200, but the number of flexible films 200 is not limited thereto.

The display driver 300 may be mounted on the flexible film 200. The display driver 300 may be mounted on a central portion of the flexible film 200, but is not limited thereto. For example, the display driver 300 may be implemented as an integrated circuit. The display driver 300 may receive digital video data and data control signals from the timing controller 800, convert the digital video data into analog data voltages according to the data control signals, and supply the analog data voltages to the data lines through the fan-out lines. The display driver 300 may generate gate signals according to gate control signals supplied from the timing controller 800 and sequentially supply the gate signals to the gate lines according to a set order. Accordingly, the display driver 300 may simultaneously serve as a data driver and a gate driver. The display device may include the display driver 300 disposed on the lower side of the non-display area NDA, and thus, sizes of the left, right, and upper sides of the non-display area NDA may be minimized.

The first circuit board 400 may electrically connect the flexible film 200 and the cable 500 to each other. The first circuit board 400 may supply a source voltage supplied from the power supply unit 700 and a signal supplied from the timing controller 800 to the flexible film 200 and the display driver 300. For example, the signal lines and the power lines may be provided on the first circuit board 400.

The cable 500 may electrically connect the first circuit board 400 and the second circuit board 600 to each other. The cable 500 may supply the source voltage supplied from the power supply unit 700 and the signal supplied from the timing controller 800 to the first circuit board 400.

The power supply unit 700 and the timing controller 800 may be mounted on the second circuit board 600. The second circuit board 600 may supply the source voltage supplied from the power supply unit 700 and the signal supplied from the timing controller 800 to the cable 500.

The power supply unit 700 may be mounted on the second circuit board 600 and may supply the source voltage. For example, the power supply unit 700 may generate a high-potential voltage or a driving voltage and supply the high-potential voltage or the driving voltage to a high potential line of the display panel 100, may generate a low-potential voltage and supply the low-potential voltage to a low potential line, and may generate an initialization voltage and supply the initialization voltage to an initialization voltage line.

The timing controller 800 may be mounted on the second circuit board 600 and may receive image data and timing synchronization signals supplied from a display driving system or a graphic device through a user connector provided on the second circuit board 600. The timing controller 800 may generate the digital video data by aligning the image data to be suitable for a pixel arrangement structure based on the timing synchronization signals, and may supply the generated digital video data to the display driver 300. The timing controller 800 may generate the data control signals and the gate control signals based on the timing synchronization signals. The timing controller 800 may control a supply timing of data voltages of the display driver 300 based on the data control signals, and control a supply timing of the gate signals of the display driver 300 based on the gate control signals.

Figure 2:
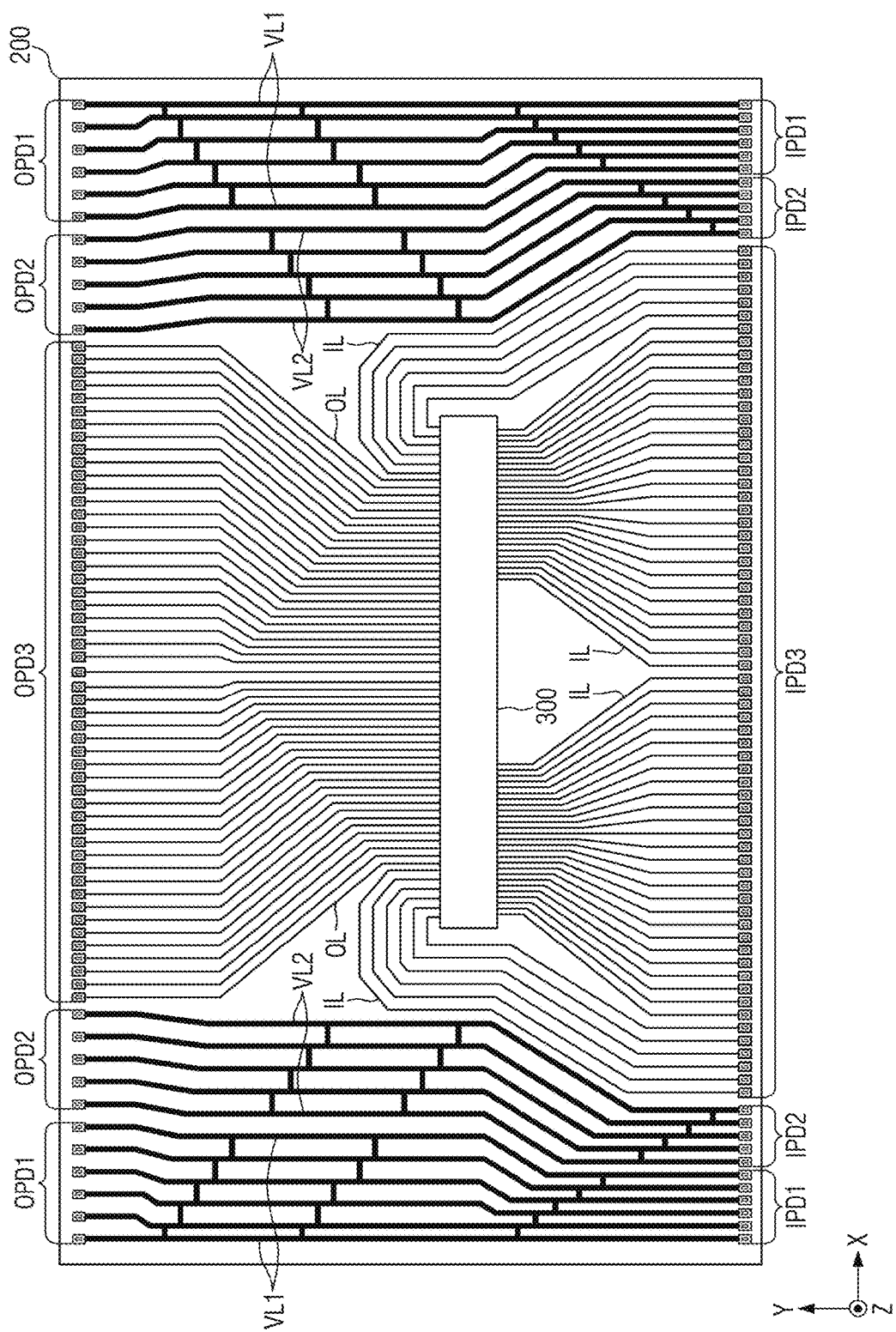
FIG. 2 is a schematic plan view illustrating a flexible film according to an embodiment.
Figure 3:
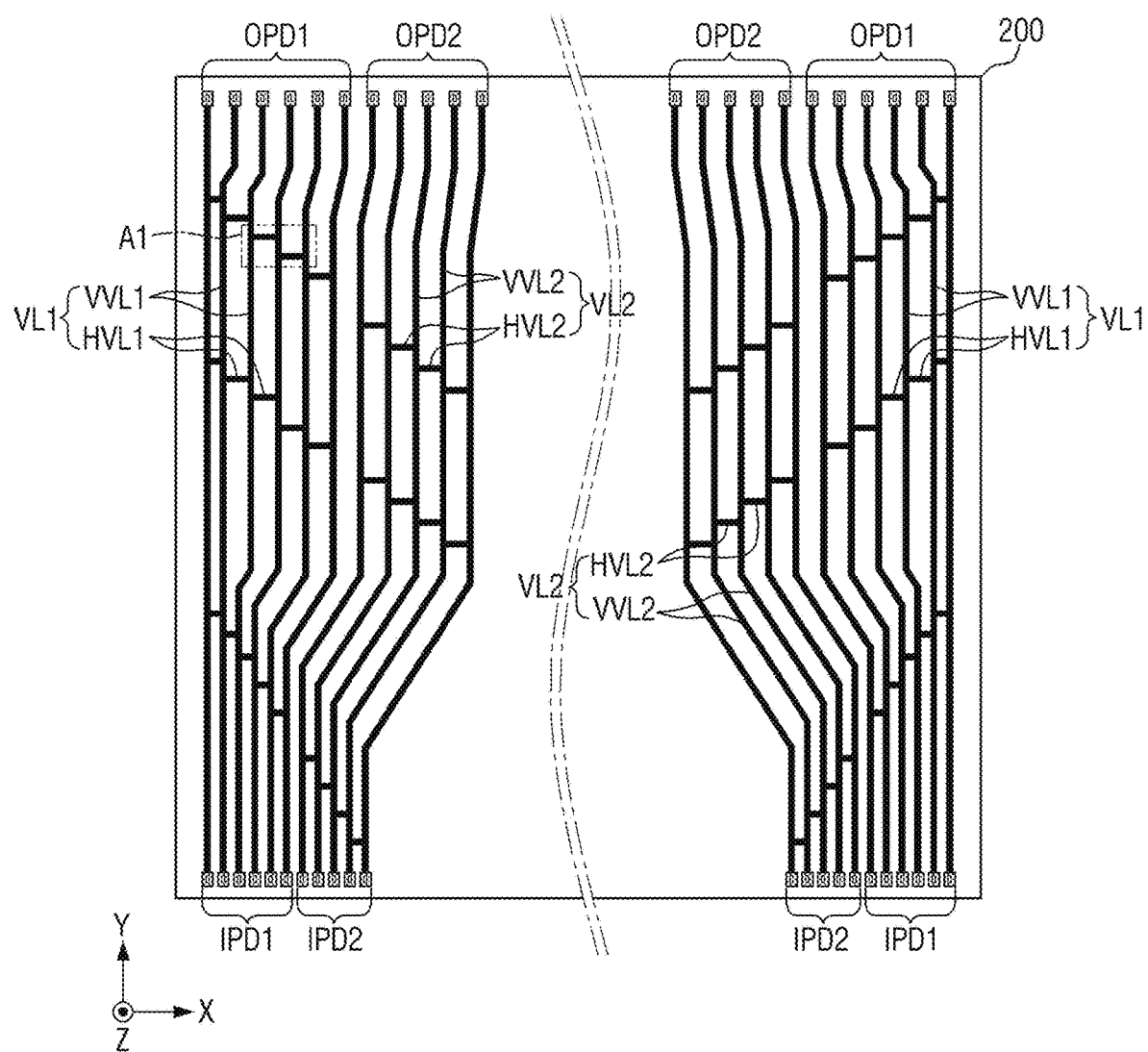
FIG. 3 is a view illustrating first voltage lines and second voltage lines of FIG. 2.
Figure 4:
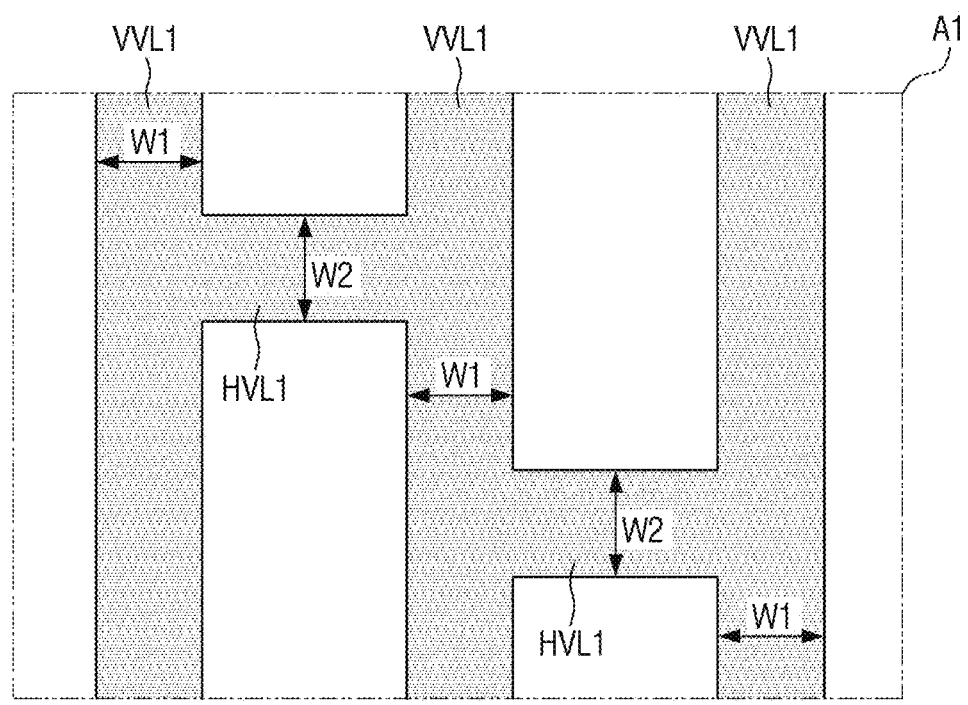
FIG. 4 is an enlarged view of area A1 of FIG. 3.

FIG. 2 is a schematic plan view illustrating a flexible film according to an embodiment, FIG. 3 is a view illustrating first voltage lines and second voltage lines of FIG. 2, and FIG. 4 is an enlarged view of area A1 of FIG. 3.

Referring to FIGS. 2 to 4, the flexible film 200 may include first to third input pad parts IPD1, IPD2, and IPD3, first and second voltage lines VL1 and VL2, input lines IL, output lines OL, and first to third output pad parts OPD1, OPD2, and OPD3.

The first input pad parts IPD1 may be disposed at one edge or an edge of the flexible film 200. For example, the first input pad parts IPD1 may be disposed adjacent to corners of the flexible film 200 at a lower edge of the flexible film 200. Some or a number of the first input pad parts IPD1 may be disposed on the left side of the flexible film 200, and the others of the first input pad parts IPD1 may be disposed on the right side of the flexible film 200. The first input pad parts IPD1 may be connected to output terminals of the first circuit board 400. The first input pad parts IPD1 may supply a first voltage received from the power supply unit 700 through the first circuit board 400, the cable 500, and the second circuit board 600 to the first voltage lines VL1. For example, the first voltage may be a high-potential voltage or a driving voltage, but is not limited thereto. The number of first input pad parts IPD1 may be changed depending on a shape of the flexible film 200 and a design of the first voltage lines VL1.

The second input pad parts IPD2 may be disposed at one edge or an edge of the flexible film 200. For example, the second input pad parts IPD2 may be disposed between the first input pad parts IPD1 and the third input pad parts IPD3 at the lower edge of the flexible film 200. Some or a number of the second input pad parts IPD2 may be disposed on the left side of the flexible film 200, and the others of the second input pad parts IPD2 may be disposed on the right side of the flexible film 200. The second input pad parts IPD2 may be connected to output terminals of the first circuit board 400. The second input pad parts IPD2 may supply a second voltage received from the power supply unit 700 through the first circuit board 400, the cable 500, and the second circuit board 600 to the second voltage lines VL2. The second voltage may be lower than the first voltage. For example, the second voltage may be a low potential voltage, but is not limited thereto. The number of second input pad parts IPD2 may be changed depending on the shape of the flexible film 200 and a design of the second voltage lines VL2.

The third input pad parts IPD3 may be disposed at one edge or an edge of the flexible film 200. For example, the third input pad parts IPD3 may be disposed between the second input pad parts IPD2 at the lower edge of the flexible film 200. The third input pad parts IPD3 may be disposed on the lower side of the display driver 300. The third input pad parts IPD3 may be connected to output terminals of the first circuit board 400. The third input pad parts IPD3 may supply the source voltage received from the power supply unit 700 and the signal supplied from the timing controller 800 through the first circuit board 400, the cable 500, and the second circuit board 600 to the input lines IL. The number of third input pad parts IPD3 may be changed depending on the shape of the flexible film 200 and a design of the input lines IL.

The first voltage line VL1 may be connected between the first input pad part IPD1 and the first output pad part OPD1. The first voltage line VL1 may supply the first voltage received from the first input pad part IPD1 to the first output pad part OPD1 The first voltage lines VL1 may be disposed at both edges of the flexible film 200. For example, the first voltage lines VL1 may be disposed at left and right edges of the flexible film 200.

The first voltage line VL1 may include first vertical voltage lines VVL1 and first horizontal voltage lines HVL1. The first vertical voltage lines VVL1 may extend in the second direction (Y-axis direction) and may be spaced apart from each other in the first direction (X-axis direction). The first vertical voltage lines VVL1 may be disposed adjacent to each other and may extend from the first input pad parts IPD1 to the first output pad parts OPD1. Line resistors of the first vertical voltage lines VVL1 may be substantially the same as each other. As an example, in case that lengths of the first vertical voltage lines VVL1 are substantially the same as each other, widths of the first vertical voltage lines VVL1 may be substantially the same as each other. As another example, as lengths of the first vertical voltage lines VVL1 increase, widths of the first vertical voltage lines VVL1 may increase.

The first horizontal voltage lines HVL1 may extend in the first direction (X-axis direction), and may be connected between adjacent first vertical voltage lines VVL1. The first horizontal voltage lines HVL1 may be spaced apart from each other in a diagonal direction between the first direction (X-axis direction) and the second direction (Y-axis direction), but are not limited thereto. The first horizontal voltage lines HVL1 may electrically connect the adjacent first vertical voltage lines VVL1 to each other. Line resistors of the first horizontal voltage lines HVL1 may be substantially the same as each other. For example, lengths and widths of the first horizontal voltage lines HVL1 may be substantially the same as each other.

In FIG. 4, a width of the first horizontal voltage lines HVL1 may be greater than or equal to a width of the first vertical voltage lines VVL1. The first vertical voltage lines VVL1 may have a first width W1, and the first horizontal voltage lines HVL1 may have a second width W2 greater than or equal to the first width W1. Since the first horizontal voltage lines HVL1 have a width greater than or equal to that of the first vertical voltage lines VVL1, a deviation between magnitudes of currents flowing to the first vertical voltage lines VVL1 may be minimized even in case that resistances of load resistors of the display panel 100 each connected to the first vertical voltage lines VVL1 are different from each other.

The second voltage line VL2 may be connected between the second input pad part IPD2 and the second output pad part OPD2. The second voltage line VL2 may supply the second voltage received from the second input pad part IPD2 to the second output pad part OPD2. The second voltage lines VL2 may be disposed between the first voltage lines VL1 and the display driver 300. For example, the second voltage lines VL2 may be disposed on the left side and the right side of the display driver 300.

The second voltage line VL2 may include second vertical voltage lines VVL2 and second horizontal voltage lines HVL2. The second vertical voltage lines VVL2 may extend in the second direction (Y-axis direction) and may be spaced apart from each other in the first direction (X-axis direction). The second vertical voltage lines VVL2 may be disposed adjacent to each other and may extend from the second input pad parts IPD2 to the second output pad parts OPD2. Line resistors of the second vertical voltage lines VVL2 may be substantially the same as each other. As an example, in case that lengths of the second vertical voltage lines VVL2 are substantially the same as each other, widths of the second vertical voltage lines VVL2 may be substantially the same as each other. As another example, as lengths of the second vertical voltage lines VVL2 increase, widths of the second vertical voltage lines VVL2 may increase.

The second horizontal voltage lines HVL2 may extend in the first direction (X-axis direction), and may be connected between adjacent second vertical voltage lines VVL2. The second horizontal voltage lines HVL2 may be spaced apart from each other in the diagonal direction between the first direction (X-axis direction) and the second direction (Y-axis direction), but are not limited thereto. The second horizontal voltage lines HVL2 may electrically connect the adjacent second vertical voltage lines VVL2 to each other. Line resistors of the second horizontal voltage lines HVL2 may be substantially the same as each other. For example, lengths and widths of the second horizontal voltage lines HVL2 may be substantially the same as each other.

A width of the second horizontal voltage lines HVL2 may be greater than or equal to a width of the second vertical voltage lines VVL2. Since the second horizontal voltage lines HVL2 have a width greater than or equal to that of the second vertical voltage lines VVL2, a deviation between magnitudes of currents flowing to the second vertical voltage lines VVL2 may be minimized even in case that resistances of load resistors of the display panel 100 each connected to the second vertical voltage lines VVL2 are different from each other.

The input lines IL may be connected between the third input pad parts IPD3 and the display driver 300. The input lines IL may be disposed between the second voltage lines VL2 on the lower side of the display driver 300. The input lines IL may supply the source voltage or the signal received from the third input pad parts IPD3 to the display driver 300. Some or a number of the input lines IL may extend from the third input pad parts IPD3 in the second direction (Y-axis direction) and may be connected to lower input terminals of the display driver 300. The others of the input lines IL may extend from the third input pad part IPD3 in the second direction (Y-axis direction), may be bent at least once, and may be connected to upper input terminals of the display driver 300.

The output lines OL may be connected between the display driver 300 and the third output pad parts OPD3. The output lines OL may be disposed between the second voltage lines VL2 on the upper side of the display driver 300. The output lines OL may supply a voltage or a signal received from the display driver 300 to the third output pad parts OPD3. The output lines OL may extend from output terminals disposed on the upper side of the display driver 300 in the second direction (Y-axis direction), and may be spaced apart from each other in the first direction (X-axis direction).

The first output pad parts OPD1 may be disposed at the other edge of the flexible film 200. For example, the first output pad parts OPD1 may be disposed adjacent to corners of the flexible film 200 at an upper edge of the flexible film 200. Some or a number of the first output pad parts OPD1 may be disposed on the left side of the flexible film 200, and the others of the first output pad parts OPD1 may be disposed on the right side of the flexible film 200. The first output pad parts OPD1 may be connected to pad parts of the display panel 100. The first output pad parts OPD1 may supply the first voltage received from the first voltage lines VL1 to the pad parts. The number of first output pad parts OPD1 may correspond to the number of first input pads IPD1.

The second output pad parts OPD2 may be disposed at the other edge of the flexible film 200. For example, the second output pad parts OPD2 may be disposed between the first output pad parts OPD1 and the third output pad parts OPD3 at the upper edge of the flexible film 200. Some or a number of the second output pad parts OPD2 may be disposed on the left side of the flexible film 200, and the others of the second output pad parts OPD2 may be disposed on the right side of the flexible film 200. The second output pad parts OPD2 may be connected to pad parts of the display panel 100. The second output pad parts OPD2 may supply the second voltage received from the second voltage lines VL2 to the pad parts. The number of second output pad parts OPD2 may correspond to the number of second input pads IPD2.

The third output pad parts OPD3 may be disposed at the other edge of the flexible film 200. For example, the third output pad parts OPD3 may be disposed between the second output pad parts OPD2 at the upper edge of the flexible film 200. The third output pad parts OPD3 may be disposed on the upper side of the display driver 300. The third output pad parts OPD3 may be connected to pad parts of the display panel 100. The third output pad parts OPD3 may supply a voltage or a signal received from the display driver 300 to the pad parts. The number of third output pad parts OPD3 may be changed depending on an output of the display driver 300.

Figure 5:
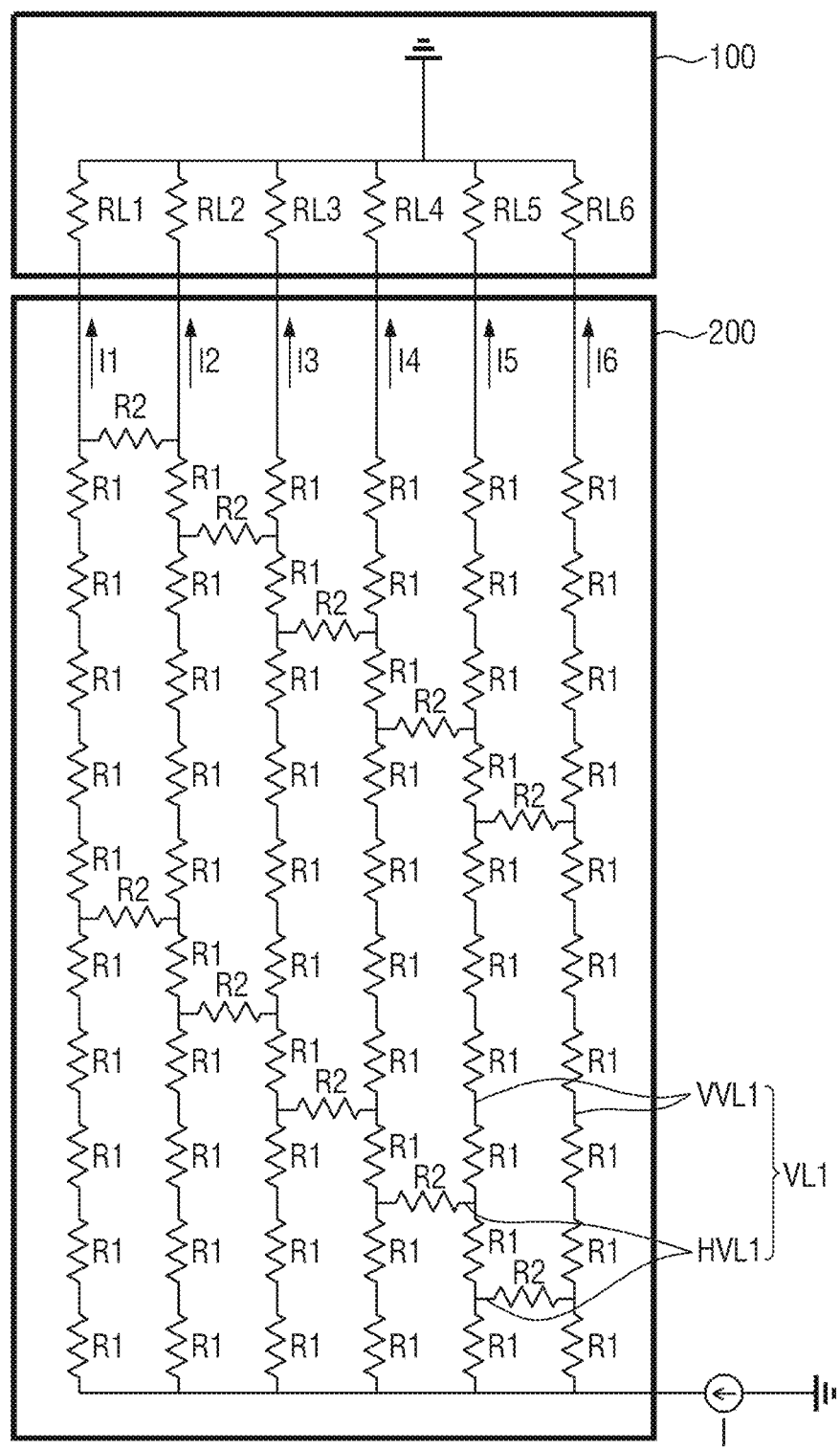
FIG. 5 is a schematic circuit diagram illustrating line resistors of first voltage lines and load resistors of a display panel, in the display device according to an embodiment.

FIG. 5 is a schematic circuit diagram illustrating line resistors of first voltage lines and load resistors of a display panel, in the display device according to an embodiment.

Referring to FIG. 5, the flexible film 200 may include a first voltage line VL1. The first voltage line VL1 may be connected between the first input pad part IPD1 and the first output pad part OPD1. The first voltage line VL1 may supply the first voltage received from the first input pad part IPD1 to the first output pad part OPD1 The first output pad part OPD1 may be electrically connected to the display panel 100 through the pad part.

The first voltage line VL1 may include first vertical voltage lines VVL1 and first horizontal voltage lines HVL1. The first vertical voltage lines VVL1 may extend in the second direction (Y-axis direction) and may be spaced apart from each other in the first direction (X-axis direction). The first vertical voltage lines VVL1 may be disposed adjacent to each other and may extend from the first input pad parts IPD1 to the first output pad parts OPD1. Line resistors of the first vertical voltage lines VVL1 may be substantially the same as each other.

The first horizontal voltage lines HVL1 may extend in the first direction (X-axis direction), and may be connected between adjacent first vertical voltage lines VVL1. The first horizontal voltage lines HVL1 may be spaced apart from each other in a diagonal direction between the first direction (X-axis direction) and the second direction (Y-axis direction), but are not limited thereto. The first horizontal voltage lines HVL1 may electrically connect the adjacent first vertical voltage lines VVL1 to each other. Line resistors of the first horizontal voltage lines HVL1 may be substantially the same as each other.

The first voltage line VL1 may receive an input current I corresponding to the first voltage from the first input pad parts IPD1. The input current I may be divided according to line resistors of the first voltage line VL1, and each of the divided currents may flow to each of the first vertical voltage lines VVL1 facing the first input pad parts IPD1. Each of the first vertical voltage lines VVL1 may include first line resistors R1, and each of the first horizontal voltage lines HVL1 may include a second line resistor R2. Here, the first line resistor R1 may be a line resistor of the first vertical voltage line VVL1 for a unit length, and the second line resistor R2 may be a line resistor of the second vertical voltage line VVL2 for a unit length. In FIG. 4, in case that the second width W2 of the first horizontal voltage line HVL1 is greater than or equal to the first width W1 of the first vertical voltage line VVL1, a resistance of the second line resistor R2 may be smaller than or equal to a resistance of the first line resistor R1. Accordingly, a current flowing to the first vertical voltage line VVL1 may flow to an adjacent first vertical voltage line VVL1 through the first horizontal voltage line HVL1. The number of first line resistors R1 may be proportional to a length of the first vertical voltage line VVL1, and is not limited to that illustrated in FIG. 5.

The display panel 100 may be connected to each of the first vertical voltage lines VVL1 through the pad parts. The display panel 100 may include first to sixth load resistors RL1, RL2, RL3, RL4, RL5, and RL6, and resistances of at least some or a number of the first to sixth load resistors RL1, RL2, RL3, RL4, RL5, and RL6 may be different from each other. In case that the first voltage line VL1 does not include the first horizontal voltage lines HVL1, a relatively large current may flow to the first vertical voltage lines VVL1 connected to load resistors having a relatively small resistance among the first to sixth load resistors RL1, RL2, RL3, RL4, RL5, and RL6, and a relatively small current may flow to the first vertical voltage lines VVL1 connected to load resistors having a relatively large resistance among the first to sixth load resistors RL1, RL2, RL3, RL4, RL5, and RL6. Accordingly, in case that the first voltage line VL1 does not include the first horizontal voltage lines HVL1, the current may be concentrated on some or a number of the first vertical voltage lines VVL1 to cause ignition or smoke in the flexible film 200.

The first voltage line VL1 may include the first horizontal voltage lines HVL1, and thus, the adjacent first vertical voltage lines VVL1 may be electrically connected to each other. The first horizontal voltage lines HVL1 may electrically connect the adjacent first vertical voltage lines VVL1 to each other to minimize a deviation between a magnitude of the current flowing to the first vertical voltage lines VVL1 connected to the load resistors having the relatively small resistance among the first to sixth load resistors RL1, RL2, RL3, RL4, RL5, and RL6 and a magnitude of the current flowing to the first vertical voltage lines VVL1 connected to the load resistors having the relatively large resistance among the first to sixth load resistors RL1, RL2, RL3, RL4, RL5, and RL6. For example, even in case that a resistance of the second to fifth load resistors RL2, RL3, RL4, and RL5 corresponds to 5 kΩ or about 5 kΩ, and a resistance of the first load resistor RL1 corresponds to 1 kΩ or about 1 kΩ, and a resistance of the of the sixth load resistor RL6 corresponds to 10 kΩ or about 10 kΩ, a deviation between magnitudes of currents I1, I2, I3, I4, I5, and I6 each connected to the first to sixth load resistors RL1, RL2, RL3, RL4, RL5, and RL6 may be minimized. Accordingly, the first voltage line VL1 may include the first horizontal voltage lines HVL1, and it is thus possible to prevent the current from being concentrated on some or a number of the first vertical voltage lines VVL1 to prevent the ignition or the smoke of the flexible film 200.

Figure 6:
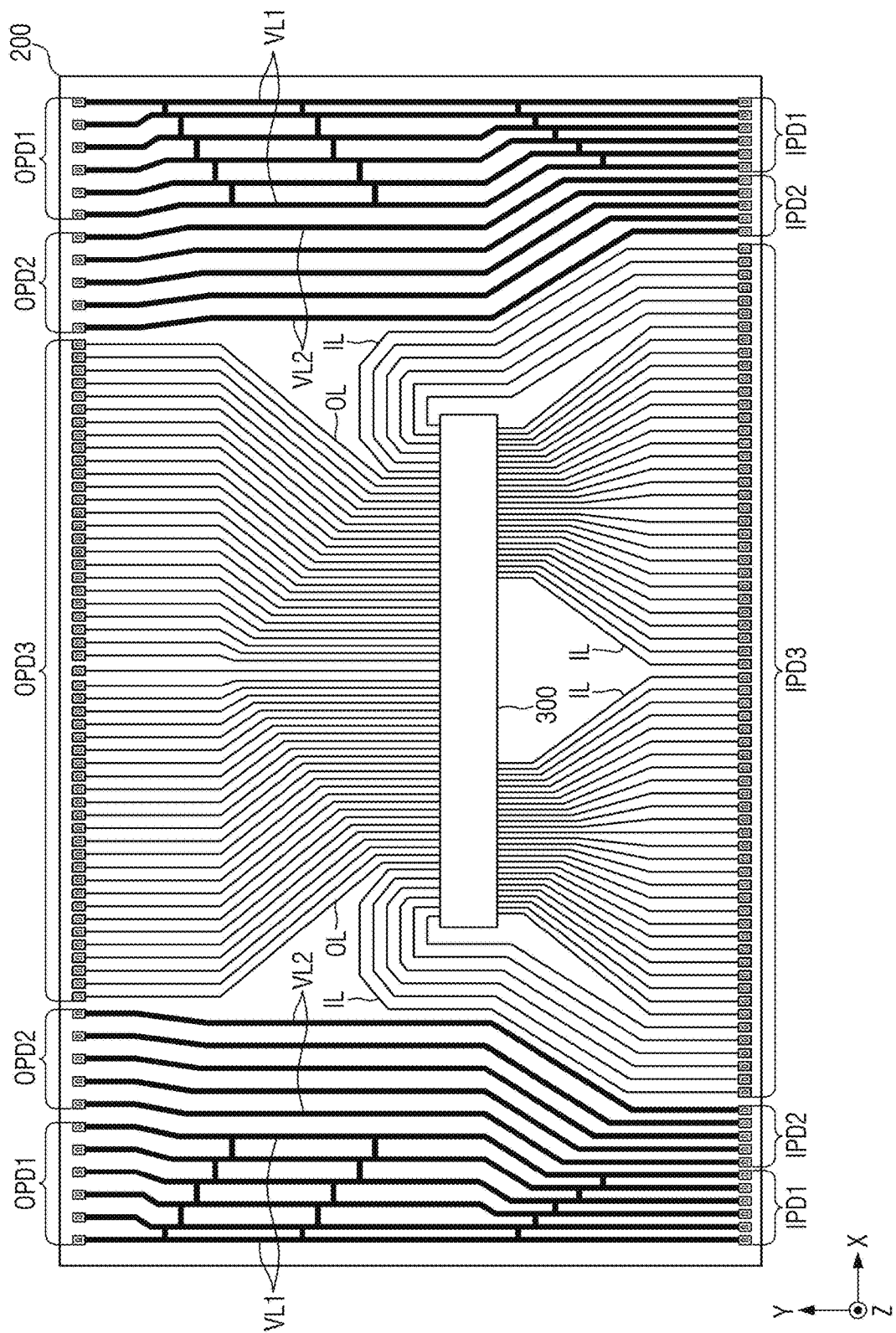
FIG. 6 is a schematic plan view illustrating a flexible film according to an embodiment.
Figure 7:
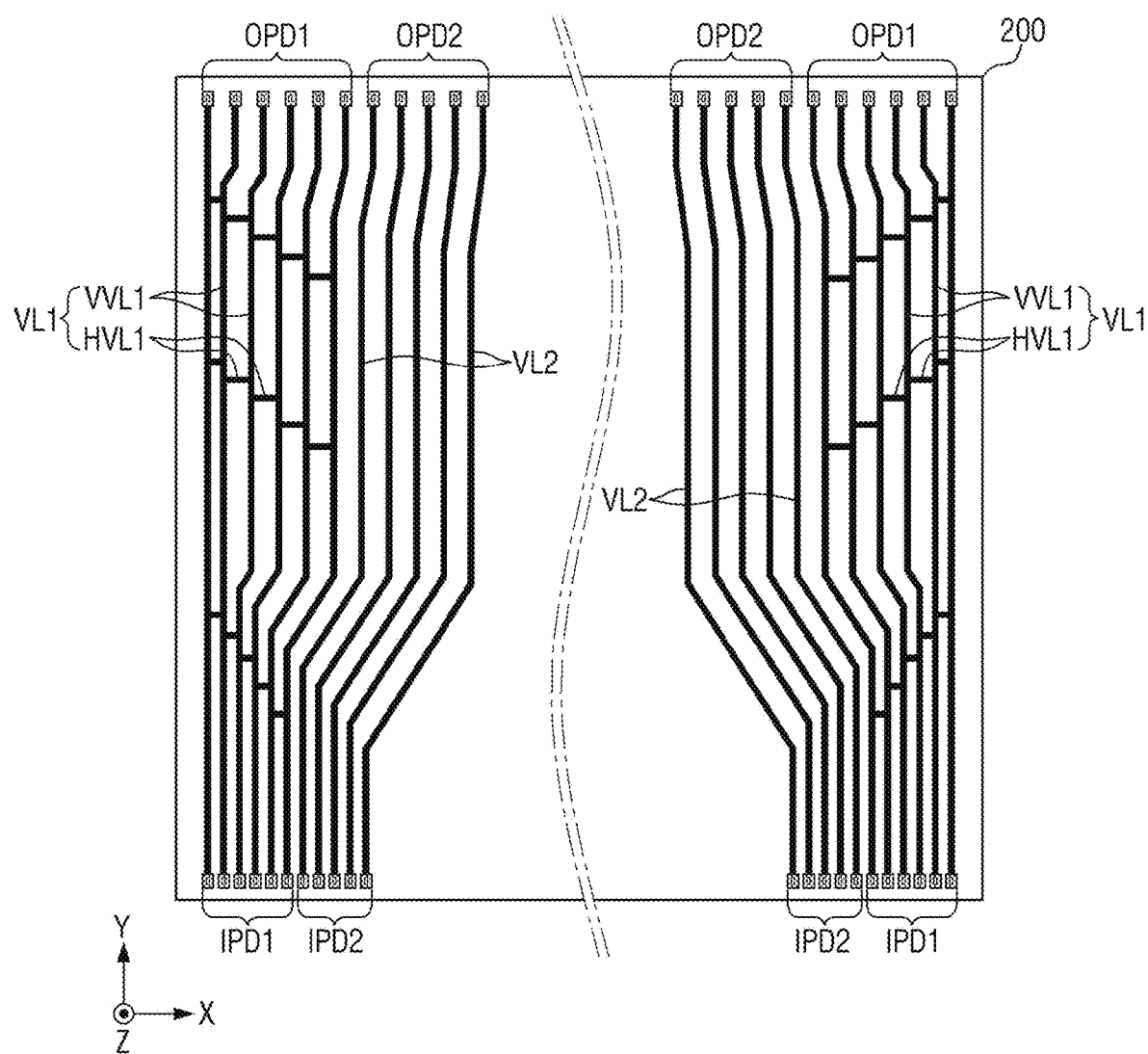
FIG. 7 is a view illustrating first voltage lines and second voltage lines of FIG. 6.

FIG. 6 is a schematic plan view illustrating a flexible film according to an embodiment, and FIG. 7 is a view illustrating first voltage lines and second voltage lines of FIG. 6. A flexible film 200 of FIGS. 6 and 7 is different in a configuration of second voltage lines VL2 from the flexible film 200 of FIGS. 2 and 3, and the same configurations as the above-described configurations will be briefly described or a description thereof will be omitted.

Referring to FIGS. 6 and 7, the flexible film 200 may include first to third input pad parts IPD1, IPD2, and IPD3, first and second voltage lines VL1 and VL2, input lines IL, output lines OL, and first to third output pad parts OPD1, OPD2, and OPD3.

The first voltage line VL1 may be connected between the first input pad part IPD1 and the first output pad part OPD1. The first voltage line VL1 may supply the first voltage received from the first input pad part IPD1 to the first output pad part OPD1 For example, the first voltage may be a high-potential voltage or a driving voltage, but is not limited thereto. The first voltage lines VL1 may be disposed at both edges of the flexible film 200. The first voltage lines VL1 may be disposed at left and right edges of the flexible film 200.

The first voltage line VL1 may include first vertical voltage lines VVL1 and first horizontal voltage lines HVL1. The first vertical voltage lines VVL1 may extend in the second direction (Y-axis direction) and may be spaced apart from each other in the first direction (X-axis direction). The first vertical voltage lines VVL1 may be disposed adjacent to each other and may extend from the first input pad parts IPD1 to the first output pad parts OPD1. Line resistors of the first vertical voltage lines VVL1 may be substantially the same as each other.

The first horizontal voltage lines HVL1 may extend in the first direction (X-axis direction), and may be connected between adjacent first vertical voltage lines VVL1. The first horizontal voltage lines HVL1 may be spaced apart from each other in a diagonal direction between the first direction (X-axis direction) and the second direction (Y-axis direction), but are not limited thereto. The first horizontal voltage lines HVL1 may electrically connect the adjacent first vertical voltage lines VVL1 to each other. Line resistors of the first horizontal voltage lines HVL1 may be substantially the same as each other.

A width of the first horizontal voltage lines HVL1 may be greater than or equal to a width of the first vertical voltage lines VVL1. Since the first horizontal voltage lines HVL1 have a width greater than or equal to that of the first vertical voltage lines VVL1, a deviation between magnitudes of currents flowing to the first vertical voltage lines VVL1 may be minimized even in case that resistances of load resistors of the display panel 100 each connected to the first vertical voltage lines VVL1 are different from each other.

The second voltage line VL2 may be connected between the second input pad part IPD2 and the second output pad part OPD2. The second voltage line VL2 may supply the second voltage received from the second input pad part IPD2 to the second output pad part OPD2. The second voltage may be lower than the first voltage. For example, the second voltage may be a low potential voltage, but is not limited thereto. The second voltage lines VL2 may be disposed between the first voltage lines VL1 and the display driver 300. For example, the second voltage lines VL2 may be disposed on the left side and the right side of the display driver 300.

The second voltage lines VL2 may extend side by side in the second direction (Y-axis direction) and may be spaced apart from each other in the first direction (X-axis direction). The second voltage lines VL2 may be disposed adjacent to each other and may extend from the second input pad parts IPD2 to the second output pad parts OPD2. Line resistors of the second voltage lines VL2 may be substantially the same as each other.

Figure 8:
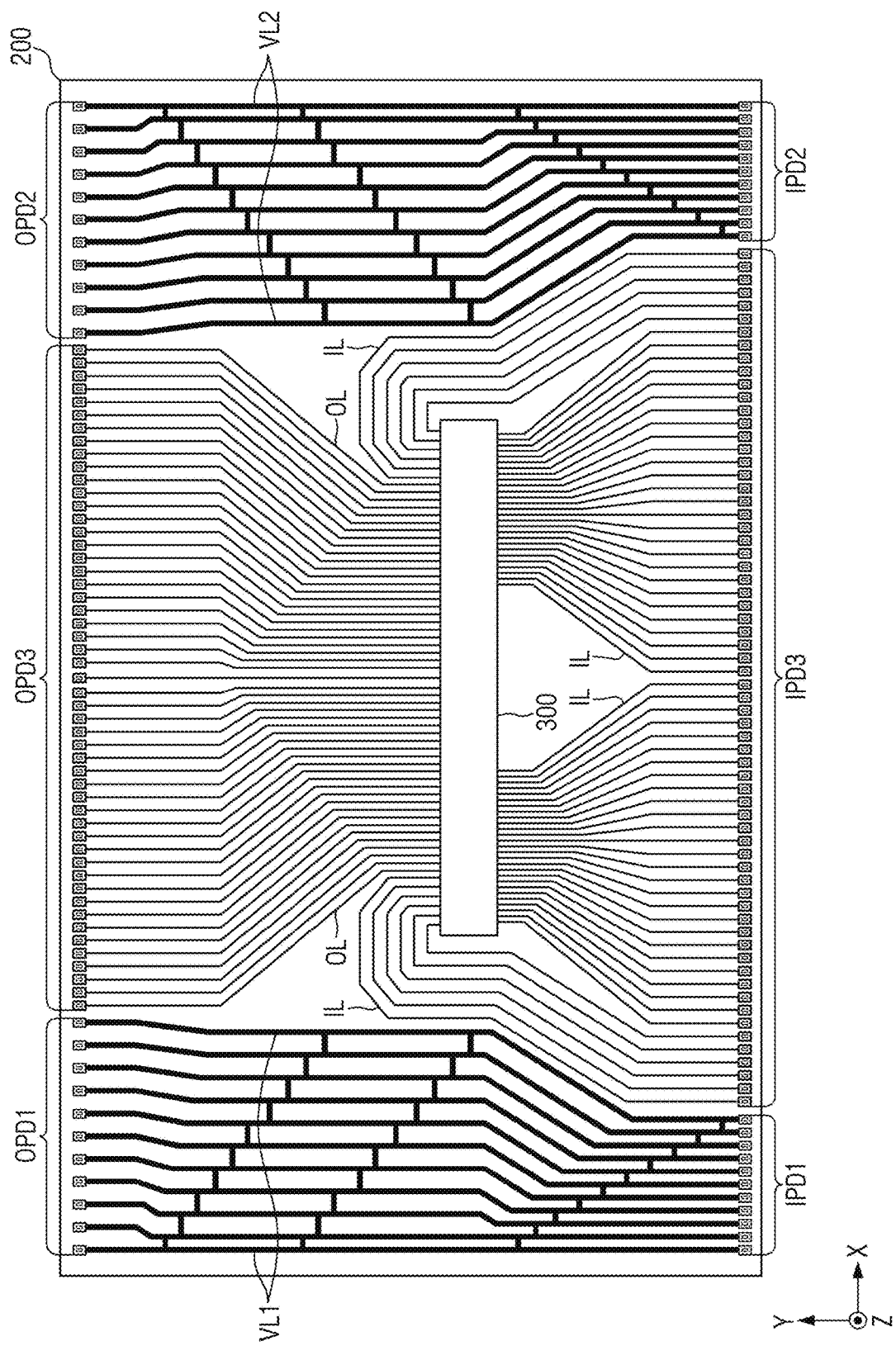
FIG. 8 is a schematic plan view illustrating a flexible film according to an embodiment.
Figure 9:
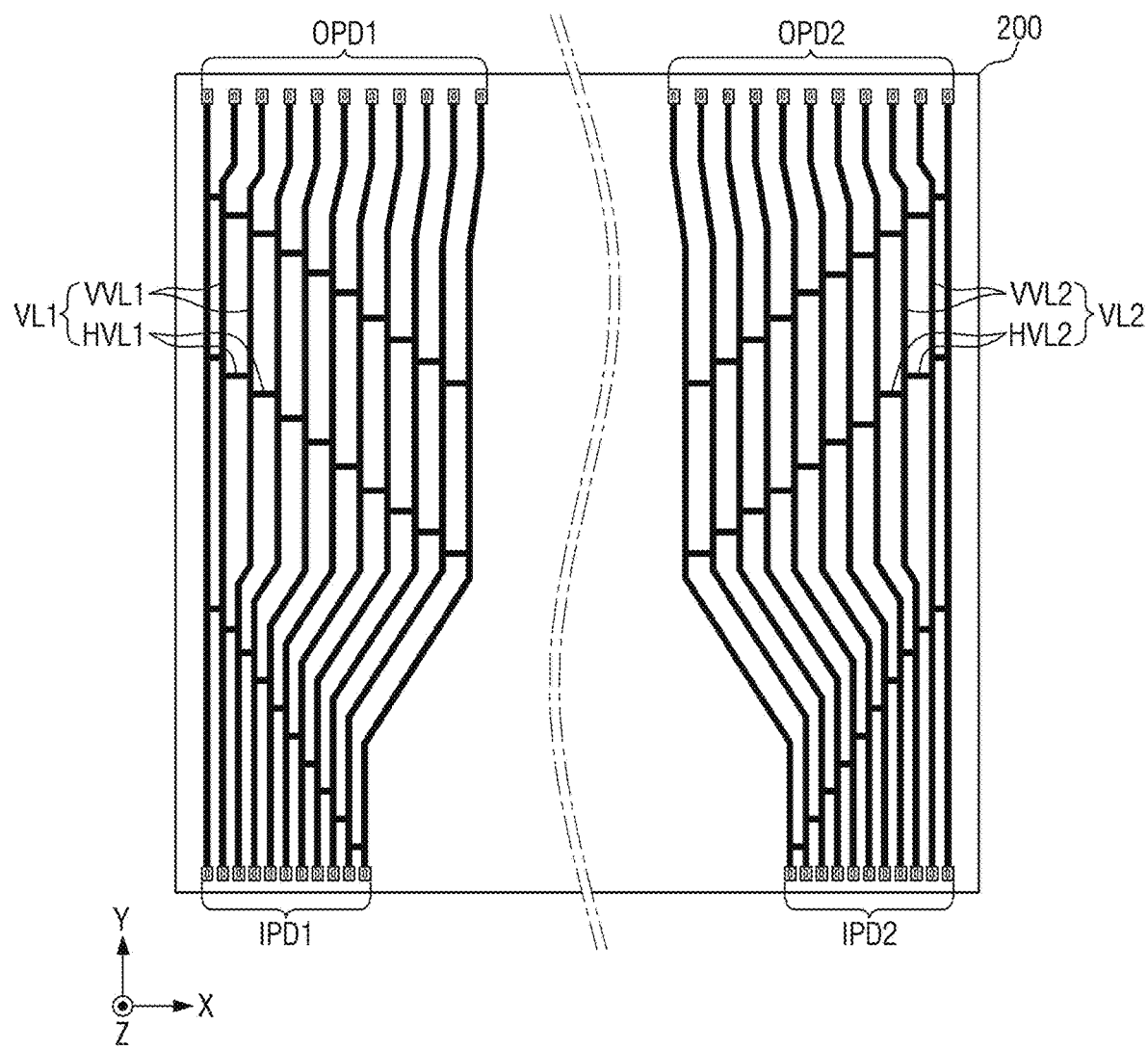
FIG. 9 is a view illustrating first voltage lines and second voltage lines of FIG. 8.

FIG. 8 is a schematic plan view illustrating a flexible film according to an embodiment, and FIG. 9 is a view illustrating first voltage lines and second voltage lines of FIG. 8. A flexible film 200 of FIGS. 8 and 9 is different in configurations of first and second input pad parts IPD1 and IPD2, first and second voltage lines VL1 and VL2, and first and second output pad parts OPD1 and OPD2 from the flexible film 200 of FIGS. 2 and 3, and the same configurations as the above-described configurations will be briefly described or a description thereof will be omitted.

Referring to FIGS. 8 and 9, the flexible film 200 may include first to third input pad parts IPD1, IPD2, and IPD3, first and second voltage lines VL1 and VL2, input lines IL, output lines OL, and first to third output pad parts OPD1, OPD2, and OPD3.

The first input pad parts IPD1 may be disposed at one edge or an edge of the flexible film 200. For example, the first input pad parts IPD1 may be disposed adjacent to a left corner of the flexible film 200 at a lower edge of the flexible film 200. The first input pad parts IPD1 may be connected to output terminals of the first circuit board 400. The first input pad parts IPD1 may supply a first voltage received from the power supply unit 700 through the first circuit board 400, the cable 500, and the second circuit board 600 to the first voltage lines VL1. For example, the first voltage may be a high-potential voltage or a driving voltage, but is not limited thereto. The number of first input pad parts IPD1 may be changed depending on a shape of the flexible film 200 and a design of the first voltage lines VL1.

The second input pad parts IPD2 may be disposed at one edge or an edge of the flexible film 200. For example, the second input pad parts IPD2 may be disposed adjacent to a right corner of the flexible film 200 at the lower edge of the flexible film 200. The second input pad parts IPD2 may be connected to output terminals of the first circuit board 400. The second input pad parts IPD2 may supply a second voltage received from the power supply unit 700 through the first circuit board 400, the cable 500, and the second circuit board 600 to the second voltage lines VL2. The second voltage may be lower than the first voltage. For example, the second voltage may be a low potential voltage, but is not limited thereto. The number of second input pad parts IPD2 may be changed depending on the shape of the flexible film 200 and a design of the second voltage lines VL2.

The first voltage line VL1 may be connected between the first input pad part IPD1 and the first output pad part OPD1. The first voltage line VL1 may supply the first voltage received from the first input pad part IPD1 to the first output pad part OPD1 The first voltage lines VL1 may be disposed at a left edge of the flexible film 200. The first voltage lines VL1 may be disposed on the left side of the display driver 300.

The first voltage line VL1 may include first vertical voltage lines VVL1 and first horizontal voltage lines HVL1. The first vertical voltage lines VVL1 may extend in the second direction (Y-axis direction) and may be spaced apart from each other in the first direction (X-axis direction). The first vertical voltage lines VVL1 may be disposed adjacent to each other and may extend from the first input pad parts IPD1 to the first output pad parts OPD1. Line resistors of the first vertical voltage lines VVL1 may be substantially the same as each other.

The first horizontal voltage lines HVL1 may extend in the first direction (X-axis direction), and may be connected between adjacent first vertical voltage lines VVL1. The first horizontal voltage lines HVL1 may be spaced apart from each other in a diagonal direction between the first direction (X-axis direction) and the second direction (Y-axis direction), but are not limited thereto. The first horizontal voltage lines HVL1 may electrically connect the adjacent first vertical voltage lines VVL1 to each other. Line resistors of the first horizontal voltage lines HVL1 may be substantially the same as each other.

A width of the first horizontal voltage lines HVL1 may be greater than or equal to a width of the first vertical voltage lines VVL1. Since the first horizontal voltage lines HVL1 have a width greater than or equal to that of the first vertical voltage lines VVL1, a deviation between magnitudes of currents flowing to the first vertical voltage lines VVL1 may be minimized even in case that resistances of load resistors of the display panel 100 each connected to the first vertical voltage lines VVL1 are different from each other.

The second voltage line VL2 may be connected between the second input pad part IPD2 and the second output pad part OPD2. The second voltage line VL2 may supply the second voltage received from the second input pad part IPD2 to the second output pad part OPD2. The second voltage lines VL2 may be disposed at a right edge of the flexible film 200. The second voltage lines VL2 may be disposed on the right side of the display driver 300.

The second voltage line VL2 may include second vertical voltage lines VVL2 and second horizontal voltage lines HVL2. The second vertical voltage lines VVL2 may extend in the second direction (Y-axis direction) and may be spaced apart from each other in the first direction (X-axis direction). The second vertical voltage lines VVL2 may be disposed adjacent to each other and may extend from the second input pad parts IPD2 to the second output pad parts OPD2. Line resistors of the second vertical voltage lines VVL2 may be substantially the same as each other.

The second horizontal voltage lines HVL2 may extend in the first direction (X-axis direction), and may be connected between adjacent second vertical voltage lines VVL2. The second horizontal voltage lines HVL2 may be spaced apart from each other in the diagonal direction between the first direction (X-axis direction) and the second direction (Y-axis direction), but are not limited thereto. The second horizontal voltage lines HVL2 may electrically connect the adjacent second vertical voltage lines VVL2 to each other. Line resistors of the second horizontal voltage lines HVL2 may be substantially the same as each other.

A width of the second horizontal voltage lines HVL2 may be greater than or equal to a width of the second vertical voltage lines VVL2. Since the second horizontal voltage lines HVL2 have a width greater than or equal to that of the second vertical voltage lines VVL2, a deviation between magnitudes of currents flowing to the second vertical voltage lines VVL2 may be minimized even in case that resistances of load resistors of the display panel 100 each connected to the second vertical voltage lines VVL2 are different from each other.

The first output pad parts OPD1 may be disposed at the other edge of the flexible film 200. For example, the first output pad parts OPD1 may be disposed adjacent to a left corner of the flexible film 200 at an upper edge of the flexible film 200. The first output pad parts OPD1 may be connected to pad parts of the display panel 100. The first output pad parts OPD1 may supply the first voltage received from the first voltage lines VL1 to the pad parts. The number of first output pad parts OPD1 may correspond to the number of first input pads IPD1.

The second output pad parts OPD2 may be disposed at the other edge of the flexible film 200. For example, the second output pad parts OPD2 may be disposed adjacent to a right corner of the flexible film 200 at the upper edge of the flexible film 200. The second output pad parts OPD2 may be connected to pad parts of the display panel 100. The second output pad parts OPD2 may supply the second voltage received from the second voltage lines VL2 to the pad parts. The number of second output pad parts OPD2 may correspond to the number of second input pads IPD2.

Figure 10:
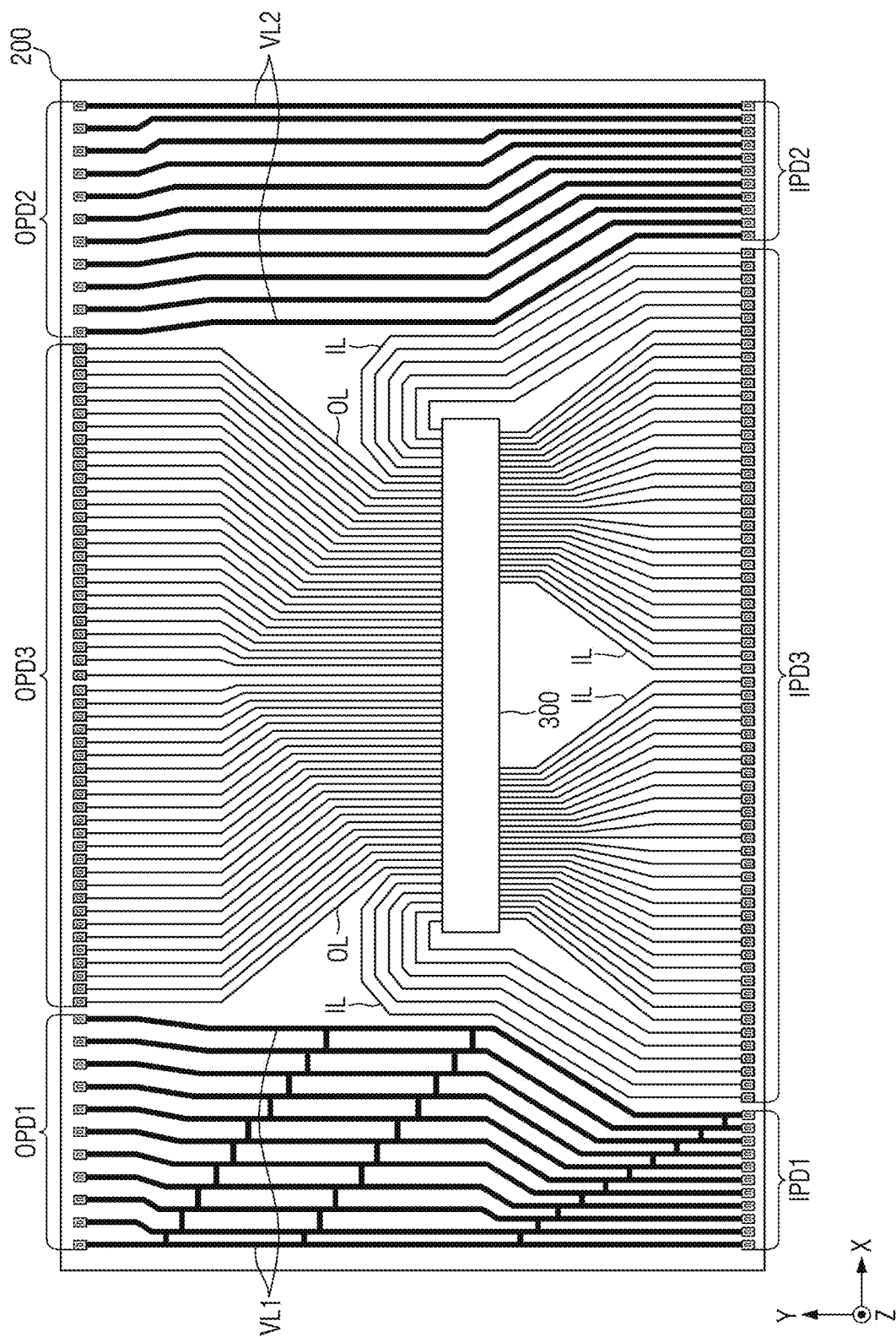
FIG. 10 is a schematic plan view illustrating a flexible film according to an embodiment.
Figure 11:
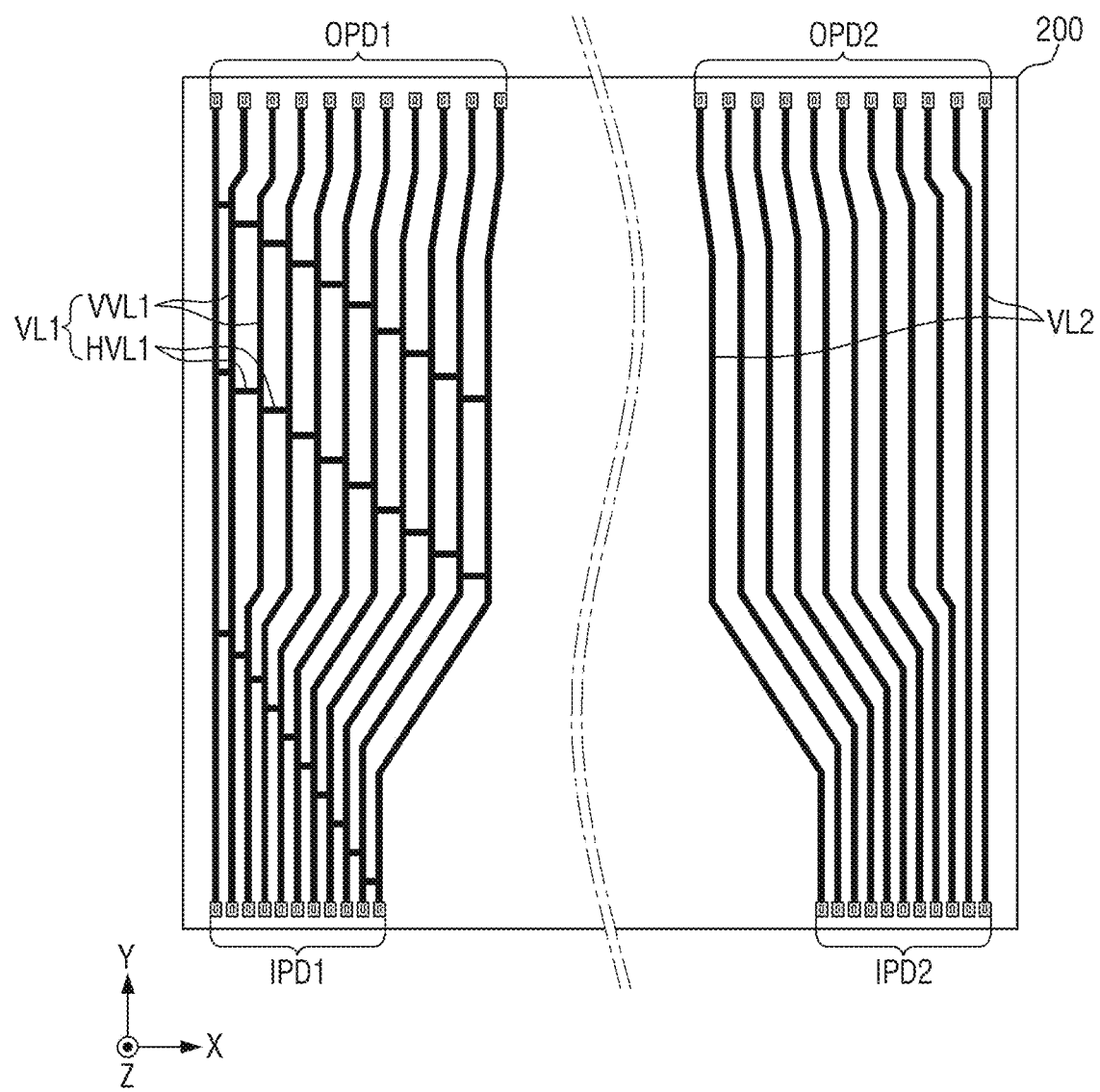
FIG. 11 is a view illustrating first voltage lines and second voltage lines of FIG. 10.

FIG. 10 is a schematic plan view illustrating a flexible film according to an embodiment, and FIG. 11 is a view illustrating first voltage lines and second voltage lines of FIG. 10. A flexible film 200 of FIGS. 10 and 11 is different in a configuration of second voltage lines VL2 from the flexible film 200 of FIGS. 8 and 9, and the same configurations as the above-described configurations will be briefly described or a description thereof will be omitted.

Referring to FIGS. 10 and 11, the flexible film 200 may include first to third input pad parts IPD1, IPD2, and IPD3, first and second voltage lines VL1 and VL2, input lines IL, output lines OL, and first to third output pad parts OPD1, OPD2, and OPD3.

The first voltage line VL1 may be connected between the first input pad part IPD1 and the first output pad part OPD1. The first voltage line VL1 may supply the first voltage received from the first input pad part IPD1 to the first output pad part OPD1 For example, the first voltage may be a high-potential voltage or a driving voltage, but is not limited thereto. The first voltage lines VL1 may be disposed at a left edge of the flexible film 200. The first voltage lines VL1 may be disposed on the left side of the display driver 300.

The first voltage line VL1 may include first vertical voltage lines VVL1 and first horizontal voltage lines HVL1. The first vertical voltage lines VVL1 may extend in the second direction (Y-axis direction) and may be spaced apart from each other in the first direction (X-axis direction). The first vertical voltage lines VVL1 may be disposed adjacent to each other and may extend from the first input pad parts IPD1 to the first output pad parts OPD1. Line resistors of the first vertical voltage lines VVL1 may be substantially the same as each other.

The first horizontal voltage lines HVL1 may extend in the first direction (X-axis direction), and may be connected between adjacent first vertical voltage lines VVL1. The first horizontal voltage lines HVL1 may be spaced apart from each other in a diagonal direction between the first direction (X-axis direction) and the second direction (Y-axis direction), but are not limited thereto. The first horizontal voltage lines HVL1 may electrically connect the adjacent first vertical voltage lines VVL1 to each other. Line resistors of the first horizontal voltage lines HVL1 may be substantially the same as each other.

A width of the first horizontal voltage lines HVL1 may be greater than or equal to a width of the first vertical voltage lines VVL1. Since the first horizontal voltage lines HVL1 have a width greater than or equal to that of the first vertical voltage lines VVL1, a deviation between magnitudes of currents flowing to the first vertical voltage lines VVL1 may be minimized even in case that resistances of load resistors of the display panel 100 each connected to the first vertical voltage lines VVL1 are different from each other.

The second voltage line VL2 may be connected between the second input pad part IPD2 and the second output pad part OPD2. The second voltage line VL2 may supply the second voltage received from the second input pad part IPD2 to the second output pad part OPD2. The second voltage may be lower than the first voltage. For example, the second voltage may be a low potential voltage, but is not limited thereto. The second voltage lines VL2 may be disposed at a right edge of the flexible film 200. The second voltage lines VL2 may be disposed on the right side of the display driver 300.

The second voltage lines VL2 may extend in the second direction (Y-axis direction) and may be spaced apart from each other in the first direction (X-axis direction). The second voltage lines VL2 may be disposed adjacent to each other and may extend from the second input pad parts IPD2 to the second output pad parts OPD2. Line resistors of the second voltage lines VL2 may be substantially the same as each other.

Figure 12:
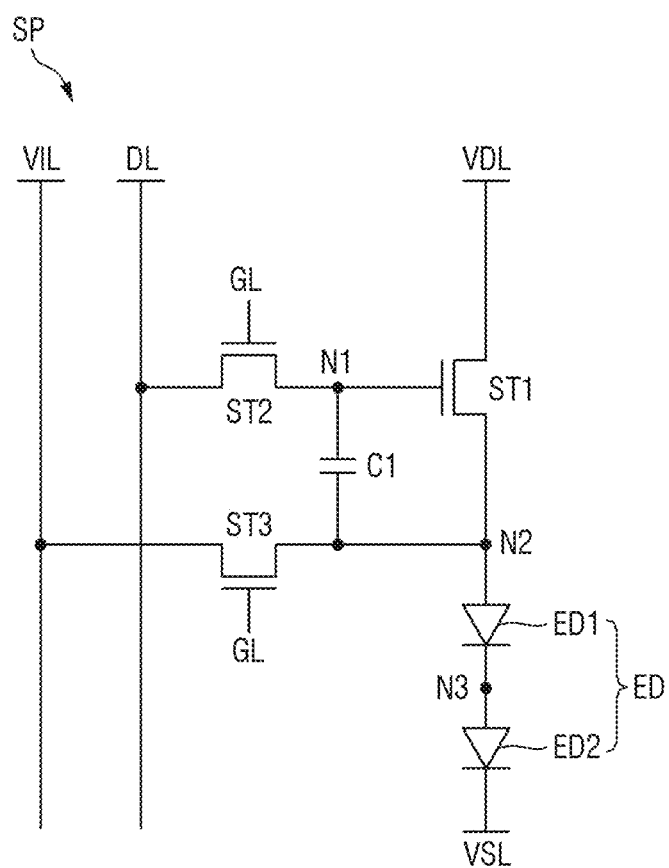
FIG. 12 is a schematic circuit diagram illustrating a pixel of the display device according to an embodiment.

FIG. 12 is a schematic circuit diagram illustrating a pixel of the display device according to an embodiment.

Referring to FIG. 12, the display area DA of the display panel 100 may include pixels SP.

Each of the pixels SP may be connected to a high potential line VDL, a data line DL, an initialization voltage line VIL, a gate line GL, and a low potential line VSL.

Each of first to third pixels SP1, SP2, and SP3 may include first to third transistors ST1, ST2, and ST3, a first capacitor C1, and light emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the high potential line VDL, and the source electrode of the first transistor ST1 may be connected to a second node N2. The first transistor ST1 may control a drain-source current (or a driving current) based on a data voltage applied to the gate electrode.

The light emitting elements ED may include a first light emitting element ED1 and a second light emitting element ED2. The first and second light emitting elements ED1 and ED2 may be connected to each other in series. The first and second light emitting elements ED1 and ED2 may receive the driving current to emit light. A light emission amount or luminance of the light emitting element ED may be proportional to a magnitude of the driving current. As an example, the light emitting element ED may be an inorganic light emitting element including an inorganic semiconductor, but is not limited thereto. As another example, the light emitting element ED may be an organic light emitting diode including an organic light emitting layer, a micro light emitting diode, or a quantum dot light emitting diode including a quantum dot light emitting layer.

A first electrode of the first light emitting element ED1 may be connected to the second node N2, and a second electrode of the first light emitting element ED1 may be connected to a third node N3. The first electrode of the first light emitting element ED1 may be connected to the source electrode of the first transistor ST1, a drain electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and a second electrode of the second light emitting element ED2 may be connected to the low potential line VSL. The first electrode of the second light emitting element ED2 may be connected to the second electrode of the first light emitting element ED1 through the third node N3.

The second transistor ST2 may be turned on by a gate signal of the gate line GL to electrically connect the data line DL and the first node N1, which is the gate electrode of the first transistor ST1, to each other. The second transistor ST2 may be turned on based on the gate signal to supply a data voltage to the first node N1. A gate electrode of the second transistor ST2 may be connected to the gate line GL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a gate signal of the gate line GL to electrically connect the initialization voltage line VIL and the second node N2, which is the source electrode of the first transistor ST1, to each other. The third transistor ST3 may be turned on based on the gate signal to supply an initialization voltage to the second node N2. A gate electrode of the third transistor ST3 may be connected to the gate line GL, the drain electrode of the third transistor ST3 may be connected to the second node N2, and a source electrode of the third transistor ST3 may be connected to the initialization voltage line VIL. The drain electrode of the third transistor ST3 may be connected to the source electrode of the first transistor ST1, the second capacitor electrode of the first capacitor C1, and the first electrode of the first light emitting element ED1 through the second node N2.

Figure 13:
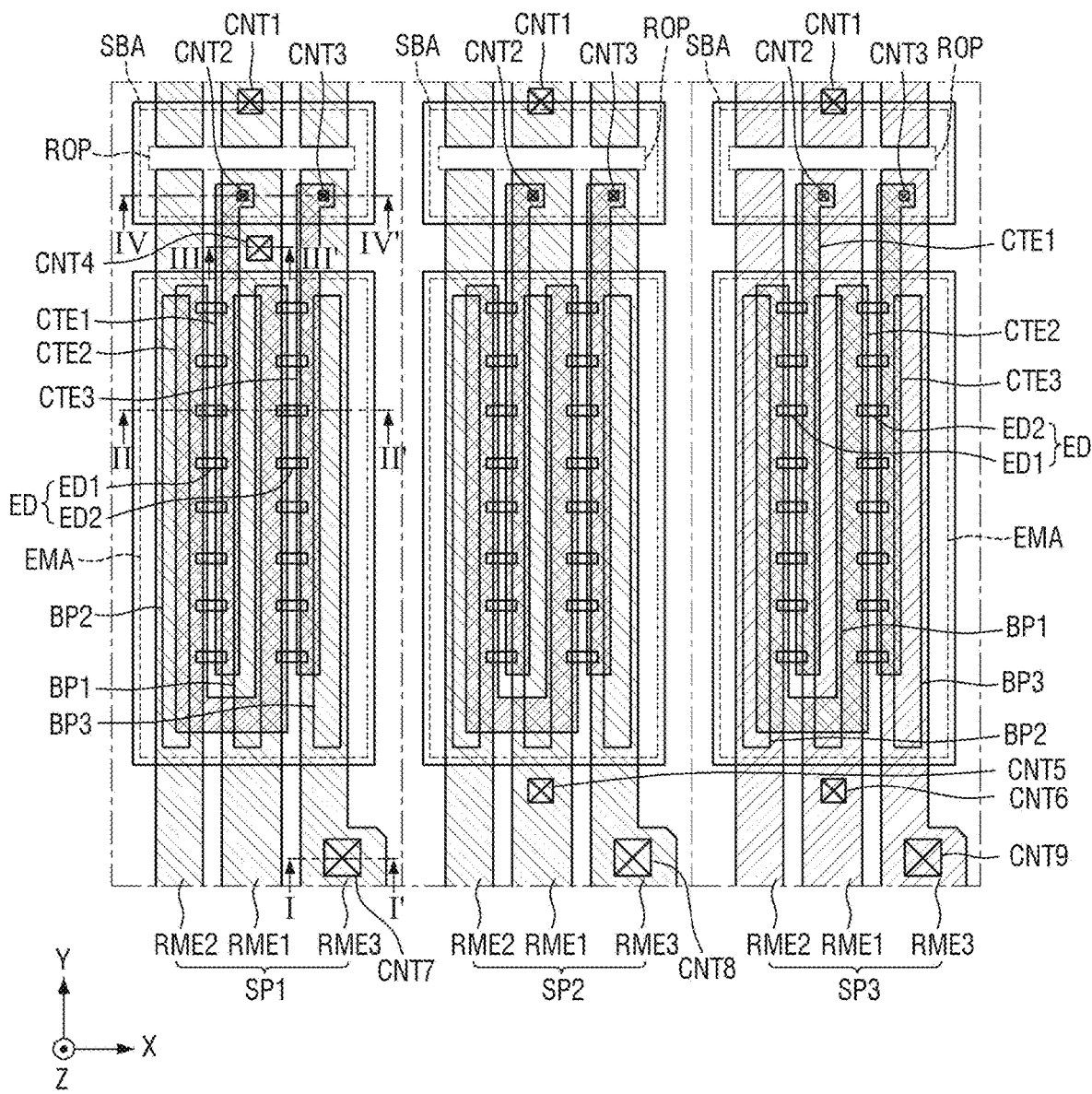
FIG. 13 is a schematic plan view illustrating a light emitting element layer of the display device according to an embodiment.
Figure 14:
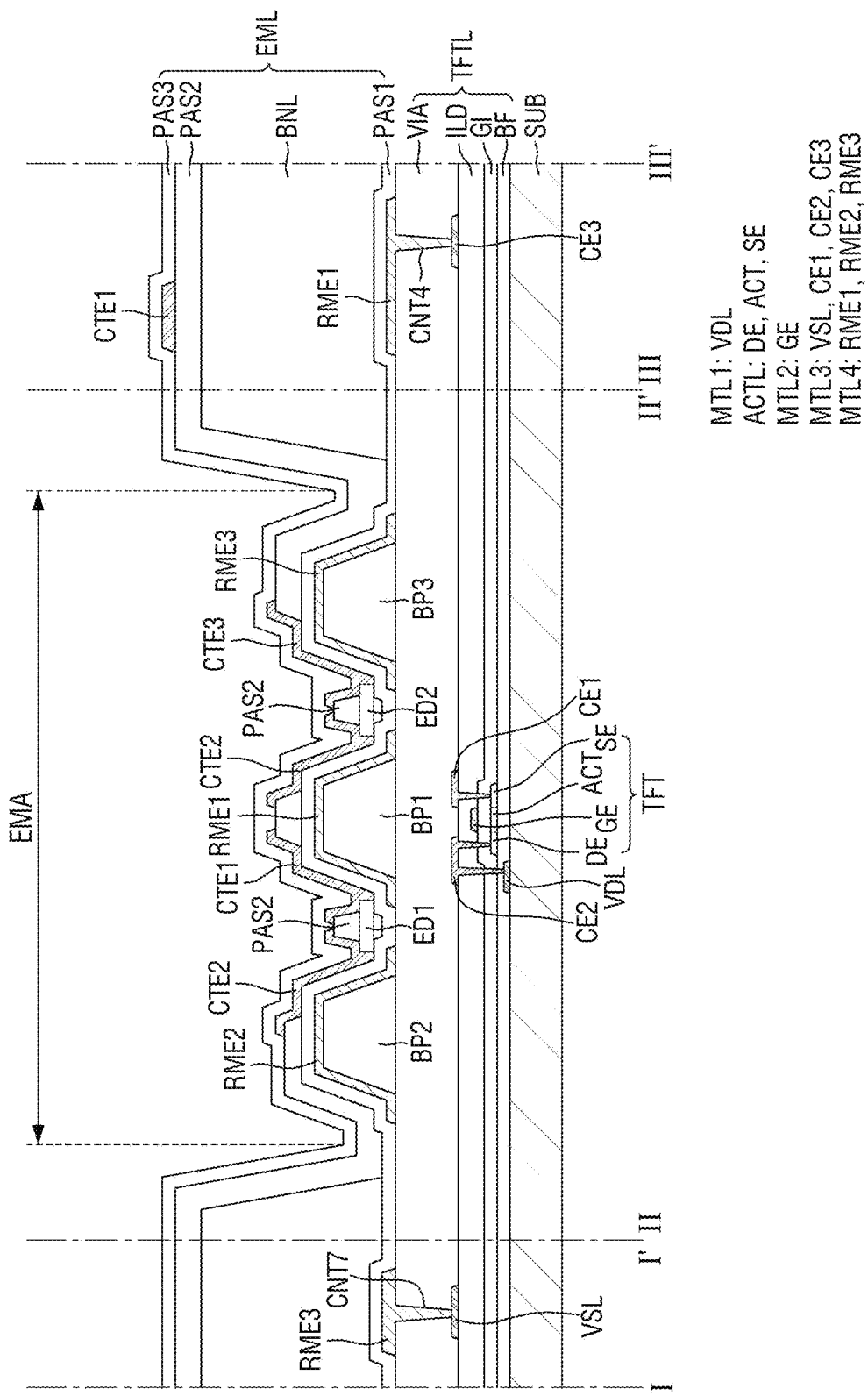
FIG. 14 is a schematic cross-sectional view taken along lines I-I', II-II', and III-III of FIG. 13.
Figure 15:
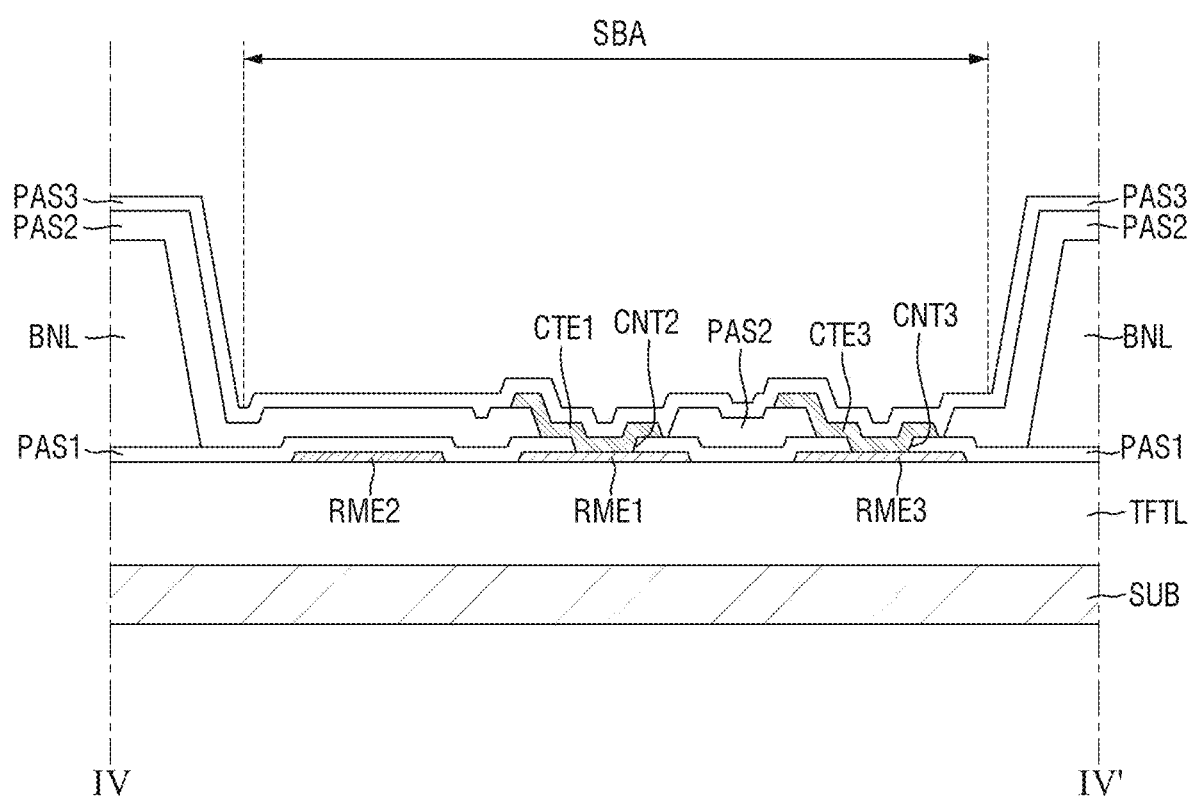
FIG. 15 is a schematic cross-sectional view taken along line IV-IV' of FIG. 13.

FIG. 13 is a schematic plan view illustrating a light emitting element layer of the display device according to an embodiment, FIG. 14 is a schematic cross-sectional view taken along lines I-I', II-II', and III-III of FIG. 13, and FIG. 15 is a schematic cross-sectional view taken along line IV-IV' of FIG. 13.

Referring to FIGS. 13 to 15, the display device may include a substrate SUB, a thin film transistor layer TFTL, and a light emitting element layer EML.

The substrate SUB may support the display device. The substrate SUB may be a base substrate or a base member. The substrate SUB may be a flexible substrate that may be bent, folded, and rolled. As an example, the substrate SUB may include an insulating material such as a polymer resin, for example, polyimide PI, but is not limited thereto. As another example, the substrate SUB may be a rigid substrate including a glass material.

The thin film transistor layer TFTL may include a high potential line VDL, a thin film transistor TFT, first to third connection electrodes CE1, CE2, and CE3, and a low potential line VSL.

The high potential line VDL may be disposed at a first metal layer MTL1 on the substrate SUB. The high potential line VDL may be electrically connected to the first voltage line VL1 of the flexible film 200. The high potential line VDL may receive the first voltage from the first voltage line VL1 of the flexible film 200. The high potential line VDL may be electrically connected to a drain electrode DE of the thin film transistor TFT through the second connection electrode CE2. The thin film transistor TFT may be a transistor of the pixel SP. Accordingly, the high potential line VDL may supply the first voltage to the pixel SP through the second connection electrode CE2.

The thin film transistor TFT may include an active region ACT, a gate electrode GE, the drain electrode DE, and a source electrode SE. The active region ACT, the drain electrode DE, and the source electrode SE may be disposed at an active layer ACTL. The active region ACT may overlap the gate electrode GE in a thickness direction (Z-axis direction). The drain electrode DE and the source electrode SE may be made into conductors by heat-treating the active layer ACTL. The active layer ACTL may be disposed on a buffer layer BF covering the first metal layer MTL1.

The gate electrode GE may be disposed at a second metal layer MTL2. The gate electrode GE may receive a gate signal to turn on the thin film transistor TFT. The second metal layer MTL2 may be disposed on a gate insulating film GI covering the active layer ACTL.

The first to third connection electrodes CE1, CE2, and CE3 may be disposed at a third metal layer MTL3. The first connection electrode CE1 may be connected to the source electrode SE of the thin film transistor TFT. The second connection electrode CE2 may electrically connect the high potential line VDL and the drain electrode DE of the thin film transistor TFT to each other. The third connection electrode CE3 may be connected to a first electrode RME1 of a fourth metal layer MTL4. The third metal layer MTL3 may be disposed on an interlayer insulating film ILD covering the second metal layer MTL2.

The low potential line VSL may be disposed at the third metal layer MTL3. The low potential line VSL may be electrically connected to the second voltage line VL2 of the flexible film 200. The low potential line VSL may receive the second voltage from the second voltage line VL2 of the flexible film 200. The low potential line VSL may be connected to a third electrode RME3 of the fourth metal layer MTL4.

The light emitting element layer EML may be disposed on the thin film transistor layer TFTL. The light emitting element layer EML may include first to third bank patterns BP1, BP2, and BP3, first to third electrodes RME1, RME2, and RME3, first and second light emitting elements ED1 and ED2, a first insulating film PAS1, a bank layer BNL, a second insulating film PAS2, first to third contact electrodes CTE1, CTE2, and CTE3, and a third insulating film PAS3.

The first bank pattern BP1 may be disposed at the center of an emission area EMA, the second bank pattern BP2 may be disposed on the left side of the emission area EMA, and the third bank pattern BP3 may be disposed on the left side of the emission area EMA. Each of the first to third bank patterns BP1, BP2, and BP3 may protrude in an upward direction (Z-axis direction) on a via layer VIA. Each of the first to third bank patterns BP1, BP2, and BP3 may have inclined side surfaces. First light emitting elements ED1 may be disposed between the first and second bank patterns BP1 and BP2 spaced apart from each other, and second light emitting elements ED2 may be disposed between the second and third bank patterns BP2 and BP3 spaced apart from each other. The first to third bank patterns BP1, BP2, and BP3 may have the same length in the second direction (Y-axis direction) and have different lengths in the first direction (X-axis direction), but are not limited thereto. The first to third bank patterns BP1, BP2, and BP3 may be disposed as island-shaped patterns on the entire surface of the display area DA.

The first to third electrodes RME1, RME2, and RME3 of each of the first to third pixels SP1, SP2, and SP3 may be disposed at the fourth metal layer MTL4. The fourth metal layer MTL4 may be disposed on the via layer VIA and the first to third bank patterns BP1, BP2, and BP3. The first electrode RME1 may extend in the second direction (Y-axis direction) at the center of the emission area EMA. The first electrode RME1 may cover an upper surface and the inclined side surfaces of the first bank pattern BP1. Accordingly, the first electrode RME1 may reflect light emitted from the first and second light emitting elements ED1 and ED2 in the upward direction (Z-axis direction).

The second electrode RME2 may extend in the second direction (Y-axis direction) on the left side of the emission area EMA. The second electrode RME2 may cover an upper surface and the inclined side surfaces of the second bank pattern BP2. Accordingly, the second electrode RME2 may reflect light emitted from the first light emitting element ED1 in the upward direction (Z-axis direction).

The third electrode RME3 may extend in the second direction (Y-axis direction) on the right side of the emission area EMA. The third electrode RME3 may cover an upper surface and the inclined side surfaces of the third bank pattern BP3. Accordingly, the third electrode RME3 may reflect light emitted from the second light emitting element ED2 in the upward direction (Z-axis direction).

Ends of the first to third electrodes RME1, RME2, and RME3 may be separated in units of rows by the separation parts ROP. The first to third electrodes RME1, RME2, and RME3 may be alignment electrodes for aligning the first and second light emitting elements ED1 and ED2 in processes of manufacturing the display device. The first electrode RME1 before being separated may receive a first voltage through a first contact hole CNT1 to serve as an alignment electrode. Accordingly, the first to third electrodes RME1, RME2, and RME3 may be separated by the separation parts ROP after a process of aligning the light emitting elements ED is completed.

The first electrode RME1 of the first pixel SP1 may be connected to the third connection electrode CE3 of the third metal layer MTL3 through a fourth contact hole CNT4. The first electrode RME1 may receive the driving current passing through the first transistor ST1 from the connection electrode. The first electrode RME1 may supply the driving current to the first light emitting elements ED1 of the first pixel SP1 through the first contact electrode CTE1.

The third electrode RME3 of the first pixel SP1 may be connected to the low potential line VSL of the third metal layer MTL3 through a seventh contact hole CNT7. Accordingly, the third electrode RME3 of the first pixel SP1 may receive the second voltage from the low potential line VSL.

The first electrode RME1 of the second pixel SP2 may be connected to the connection electrode of the third metal layer MTL3 through a fifth contact hole CNT5. The first electrode RME1 may receive the driving current passing through the first transistor ST1 from the connection electrode. The first electrode RME1 may supply the driving current to the first light emitting elements ED1 of the second pixel SP2 through the first contact electrode CTE1.

The third electrode RME3 of the second pixel SP2 may be connected to the low potential line VSL of the third metal layer MTL3 through an eighth contact hole CNT8. Accordingly, the third electrode RME3 of the second pixel SP2 may receive the second voltage from the low potential line VSL.

The first electrode RME1 of the third pixel SP3 may be connected to the connection electrode of the third metal layer MTL3 through a sixth contact hole CNT6. The first electrode RME1 may receive the driving current passing through the first transistor ST1 from the connection electrode. The first electrode RME1 may supply the driving current to the first light emitting elements ED1 of the third pixel SP3 through the first contact electrode CTE1.

The third electrode RME3 of the third pixel SP3 may be connected to the low potential line VSL of the third metal layer MTL3 through a ninth contact hole CNT9. Accordingly, the third electrode RME3 of the third pixel SP3 may receive the second voltage from the low potential line VSL.

The first light emitting elements ED1 may be aligned between the first electrode RME1 and the second electrode RME2. The first insulating film PAS1 may cover the first to third electrodes RME1, RME2, and RME3. The first light emitting elements ED1 may be insulated from the first and second electrodes RME1 and RME2 by the first insulating film PAS1. Before the first and second electrodes RME1 and RME2 are cut by the separation part ROP, each of the first and second electrodes RME1 and RME2 may receive an alignment signal, and an electric field may be formed between the first and second electrodes RME1 and RME2. For example, the first light emitting elements ED1 may be jetted onto the first and second electrodes RME1 and RME2 through an inkjet printing process, and the first light emitting elements ED1 dispersed in ink may be aligned by receiving a dielectrophoresis force by the electric field formed between the first and second electrodes RME1 and RME2. Accordingly, the first light emitting elements ED1 may be aligned along the second direction (Y-axis direction) between the first and second electrodes RME1 and RME2.

The second light emitting elements ED2 may be aligned between the first electrode RME1 and the third electrode RME3. The second light emitting elements ED2 may be insulated from the first and third electrodes RME1 and RME3 by the first insulating film PAS1. Before the first and third electrodes RME1 and RME3 are cut by the separation part ROP, each of the first and third electrodes RME1 and RME3 may receive an alignment signal, and an electric field may be formed between the first and third electrodes RME1 and RME3. For example, the second light emitting elements ED2 may be jetted onto the first and third electrodes RME1 and RME3 through an inkjet printing process, and the second light emitting elements ED2 dispersed in ink may be aligned by receiving a dielectrophoresis force by the electric field formed between the first and third electrodes RME1 and RME3. Accordingly, the second light emitting elements ED2 may be aligned along the second direction (Y-axis direction) between the first and third electrodes RME1 and RME3.

The first to third contact electrodes CTE1, CTE2, and CTE3 of each of the first to third pixels SP1, SP2, and SP3 may be disposed on the first to third electrodes RME1, RME2, and RME3. The second insulating film PAS2 may be disposed on the bank layer BNL, the first insulating film PAS1, and a central portion of the light emitting element ED. The third insulating film PAS3 may cover the second insulating film PAS2 and the first to third contact electrodes CTE1, CTE2, and CTE3. The second and third insulating films PAS2 and PAS3 may insulate the first to third contact electrodes CTE1, CTE2, and CTE3 from each other. FIG. 15 further illustrates an interval or distance SBA between steps of the third insulating film PAS3.

The first contact electrode CTE1 may be disposed on the first electrode RME1, and be connected to the first electrode RME1 through a second contact hole CNT2. The first contact electrode CTE1 may be connected between the first electrode RME1 and one ends of the first light emitting elements ED1. The first contact electrode CTE1 may correspond to an anode electrode of each of the first light emitting elements ED1, but is not limited thereto.

The second contact electrode CTE2 may be disposed on the first and second electrodes RME1 and RME2, and be insulated from the first and second electrodes RME1 and RME2. A first portion of the second contact electrode CTE2 may be disposed on the second electrode RME2 and extend in the second direction (the Y-axis direction). A second portion of the second contact electrode CTE2 may be bent from a lower side of the first portion and extend in the first direction (X-axis direction). A third portion of the second contact electrode CTE2 may be bent from a right side of the second portion and extend in the second direction (Y-axis direction), and may be disposed on the first electrode RME1.

The second contact electrode CTE2 may be connected between the other ends of the first light emitting elements ED1 and one ends of the second light emitting elements ED2. The second contact electrode CTE2 may correspond to the third node N3 of FIG. 12. The second contact electrode CTE2 may correspond to a cathode electrode of each of the first light emitting elements ED1, but is not limited thereto. The second contact electrode CTE2 may correspond to an anode electrode of each of the second light emitting elements ED2, but is not limited thereto.

The third contact electrode CTE3 may be disposed on the third electrode RME3, and be connected to the third electrode RME3 through a third contact hole CNT3. The third contact electrode CTE3 may be connected between the other ends of the second light emitting elements ED2 and the third electrode RME3. The third contact electrode CTE3 may correspond to a cathode electrode of each of the second light emitting elements ED2, but is not limited thereto. The third contact electrode CTE3 may receive the second voltage through the third electrode RME3.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A flexible film comprising:
    first input pad parts and second input pad parts;
    first output pad parts corresponding to the first input pad parts and second output pad parts corresponding to the second input pad parts;
    a first voltage line supplying a first voltage received from the first input pad parts to the first output pad parts; and
    a second voltage line supplying a second voltage received from the second input pad parts and the second voltage being lower than the first voltage to the second output pad parts,
    wherein the first voltage line includes:
        first vertical voltage lines electrically connected between the first input pad parts and the first output pad parts; and
        first horizontal voltage lines electrically connecting adjacent first vertical voltage lines of the first vertical voltage lines to each other.

2. The flexible film of claim 1, wherein a width of each of the first horizontal voltage lines is greater than or equal to a width of each of the first vertical voltage lines.

3. The flexible film of claim 1, wherein a resistance of a first line resistor for a unit length of the first vertical voltage lines is greater than a resistance of a second line resistor for a unit length of the first horizontal voltage lines.

4. The flexible film of claim 1, wherein the second voltage line includes:
    second vertical voltage lines electrically connected between the second input pad parts and the second output pad parts; and
    second horizontal voltage lines electrically connecting adjacent second vertical voltage lines of the second vertical voltage lines to each other.

5. The flexible film of claim 4, wherein a width of each of the second horizontal voltage lines is greater than or equal to a width of each of the second vertical voltage lines.

6. The flexible film of claim 4, wherein
    the first voltage line is disposed at an edge of the flexible film and another edge of the flexible film opposite to the edge, and
    the second voltage line is disposed further inside the flexible film than the first voltage line.

7. The flexible film of claim 4, wherein
    the first voltage line is disposed at an edge of the flexible film, and
    the second voltage line is disposed at another edge of the flexible film opposite to the edge of the flexible film.

8. The flexible film of claim 1, wherein
    the second voltage line includes second voltage lines, and
    the second voltage lines are electrically connected between the second input pad parts and the second output pad parts and extend side by side.

9. The flexible film of claim 8, wherein
    the first voltage line is disposed at an edge of the flexible film and another edge of the flexible film opposite to the edge, and
    the second voltage line is disposed further inside the flexible film than the first voltage line.

10. The flexible film of claim 8, wherein
    the first voltage line is disposed at an edge of the flexible film, and
    the second voltage line is disposed at another edge of the flexible film opposite to the edge of the flexible film.

11. A display device comprising:
    a display panel; and
    a flexible film connected to the display panel, wherein the flexible film comprises:
        first input pad parts and second input pad parts;
        first output pad parts corresponding to the first input pad parts and second output pad parts corresponding to the second input pad parts;
        a first voltage line supplying a first voltage received from the first input pad parts to the first output pad parts; and
        a second voltage line supplying a second voltage received from the second input pad parts and the second voltage being lower than the first voltage to the second output pad parts, and
    the first voltage line includes:
        first vertical voltage lines electrically connected between the first input pad parts and the first output pad parts; and
        first horizontal voltage lines electrically connecting adjacent first vertical voltage lines of the first vertical voltage lines to each other.

12. The display device of claim 11, wherein a width of each of the first horizontal voltage lines is greater than or equal to a width of each of the first vertical voltage lines.

13. The display device of claim 11, wherein a resistance of a first line resistor for a unit length of the first vertical voltage lines is greater than a resistance of a second line resistor for a unit length of the first horizontal voltage lines.

14. The display device of claim 11, wherein the second voltage line includes:
- second vertical voltage lines electrically connected between the second input pad parts and the second output pad parts; and
- second horizontal voltage lines electrically connecting adjacent second vertical voltage lines of the second vertical voltage lines to each other.

15. The display device of claim 14, wherein a width of each of the second horizontal voltage lines is greater than or equal to a width of each of the second vertical voltage lines.

16. The display device of claim 14, further comprising:
- a display driver mounted on a central portion of the flexible film, wherein
- the first voltage line is disposed at an edge of the flexible film and another edge of the flexible film opposite to the edge, and
- the second voltage line is disposed between the first voltage line and the display driver.

17. The display device of claim 14, further comprising:
- a display driver mounted on a central portion of the flexible film, wherein
- the first voltage line is disposed on a side of the display driver, and
- the second voltage line is disposed on another side of the display driver opposite to the side of the display driver.

18. The display device of claim 11, wherein
- the second voltage line includes second voltage lines, and
- the second voltage lines are electrically connected between the second input pad parts and the second output pad parts and extend side by side.

19. The display device of claim 18, further comprising:
- a display driver mounted on a central portion of the flexible film, wherein
- the first voltage line is disposed at an edge of the flexible film and another edge of the flexible film opposite to the edge, and
- the second voltage line is disposed between the first voltage line and the display driver.

20. The display device of claim 18, further comprising:
- a display driver mounted on a central portion of the flexible film, wherein
- the first voltage line is disposed on a side of the display driver, and
- the second voltage line is disposed on another side of the display driver opposite to the side of the display driver.

* * * * *